US010559588B2

(12) United States Patent
Dong et al.

(10) Patent No.: US 10,559,588 B2
(45) Date of Patent: Feb. 11, 2020

(54) THREE-DIMENSIONAL FLAT INVERSE NAND MEMORY DEVICE AND METHOD OF MAKING THE SAME

(71) Applicant: SANDISK TECHNOLOGIES LLC, Plano, TX (US)

(72) Inventors: Yingda Dong, San Jose, CA (US); Yangyin Chen, Leuven (BE); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 16 days.

(21) Appl. No.: 15/971,525

(22) Filed: May 4, 2018

(65) Prior Publication Data
US 2019/0221575 A1 Jul. 18, 2019

Related U.S. Application Data

(60) Provisional application No. 62/616,584, filed on Jan. 12, 2018.

(51) Int. Cl.
*H01L 21/00* (2006.01)
*H01L 27/00* (2006.01)
(Continued)

(52) U.S. Cl.
CPC .... *H01L 27/11582* (2013.01); *G11C 16/0483* (2013.01); *H01L 21/0262* (2013.01);
(Continued)

(58) Field of Classification Search
CPC .......... H01L 21/0262; H01L 21/76877; H01L 21/28273; H01L 21/76802;
(Continued)

(56) References Cited

U.S. PATENT DOCUMENTS

| 5,915,167 A | 6/1999 | Leedy |
| 9,412,752 B1 | 8/2016 | Yeh et al. |

(Continued)

FOREIGN PATENT DOCUMENTS

KR 10-2011-009330 A 8/2011

OTHER PUBLICATIONS

Lue et al., "A 128 Gb (MLC)/192Gb (TLC) Singe-gate Vertical Channel (SGVC) Architecture 3D NAND using only 16 Layers with Robust Read Disturb, Long-Retention and Excellent Scaling Capability," IEDM Proceedings (2017) p. 461.

(Continued)

*Primary Examiner* — Nikolay K Yushin
(74) *Attorney, Agent, or Firm* — The Marbury Law Group PLLC

(57) ABSTRACT

A three-dimensional memory device includes alternating stacks of insulating strips and electrically conductive strips laterally spaced apart among one another by line trenches and a two-dimensional array of memory stack structures and a two-dimensional array of dielectric pillar structures located in the line trenches. Each line trench is filled with laterally alternating sequence of memory stack structures and dielectric pillar structures. Each memory stack structure contains a vertical semiconductor channel, a pair of blocking dielectrics contacting outer sidewalls of the vertical semiconductor channel, a pair of charge storage layers contacting outer sidewalls of the pair of blocking dielectrics, and a pair of tunneling dielectrics contacting outer sidewalls of the pair of charge storage layers.

20 Claims, 25 Drawing Sheets

(51) Int. Cl.
| | |
|---|---|
| *H01L 29/00* | (2006.01) |
| *G11C 16/04* | (2006.01) |
| *H01L 27/11582* | (2017.01) |
| *H01L 27/11573* | (2017.01) |
| *H01L 21/02* | (2006.01) |
| *H01L 29/20* | (2006.01) |
| *H01L 27/06* | (2006.01) |

(52) U.S. Cl.
CPC .... *H01L 27/0605* (2013.01); *H01L 27/11573* (2013.01); *H01L 29/2003* (2013.01)

(58) Field of Classification Search
CPC ......... H01L 21/31053; H01L 27/11582; H01L 27/0605; H01L 27/11573; H01L 29/2003; H01L 29/7926; H01L 29/66833; H01L 29/66825; G11C 16/0483; G11C 16/10; G11C 16/26; G11C 16/0466; G11C 16/3427
See application file for complete search history.

(56) References Cited

U.S. PATENT DOCUMENTS

| | | |
|---|---|---|
| 9,524,779 B2 | 12/2016 | Kai et al. |
| 2014/0264542 A1 | 9/2014 | Simsek-Ege et al. |
| 2014/0269078 A1 | 9/2014 | Hsiao et al. |
| 2016/0111439 A1 | 4/2016 | Tsutsumi et al. |
| 2018/0151497 A1 | 5/2018 | Makala et al. |

OTHER PUBLICATIONS

U.S. Appl. No. 15/605,204, filed May 25, 2017, SanDisk Technologies LLC.
U.S. Appl. No. 15/638,672, filed Jun. 30, 2017, SanDisk Technologies LLC.
U.S. Appl. No. 15/863,205, filed Jan. 5, 2018, SanDisk Technologies LLC.
International Search Report and Written Opinion of the International Searching Authority for International Patent Application No. PCT/US2018/061229, dated Apr. 1, 2019, 12 pages.

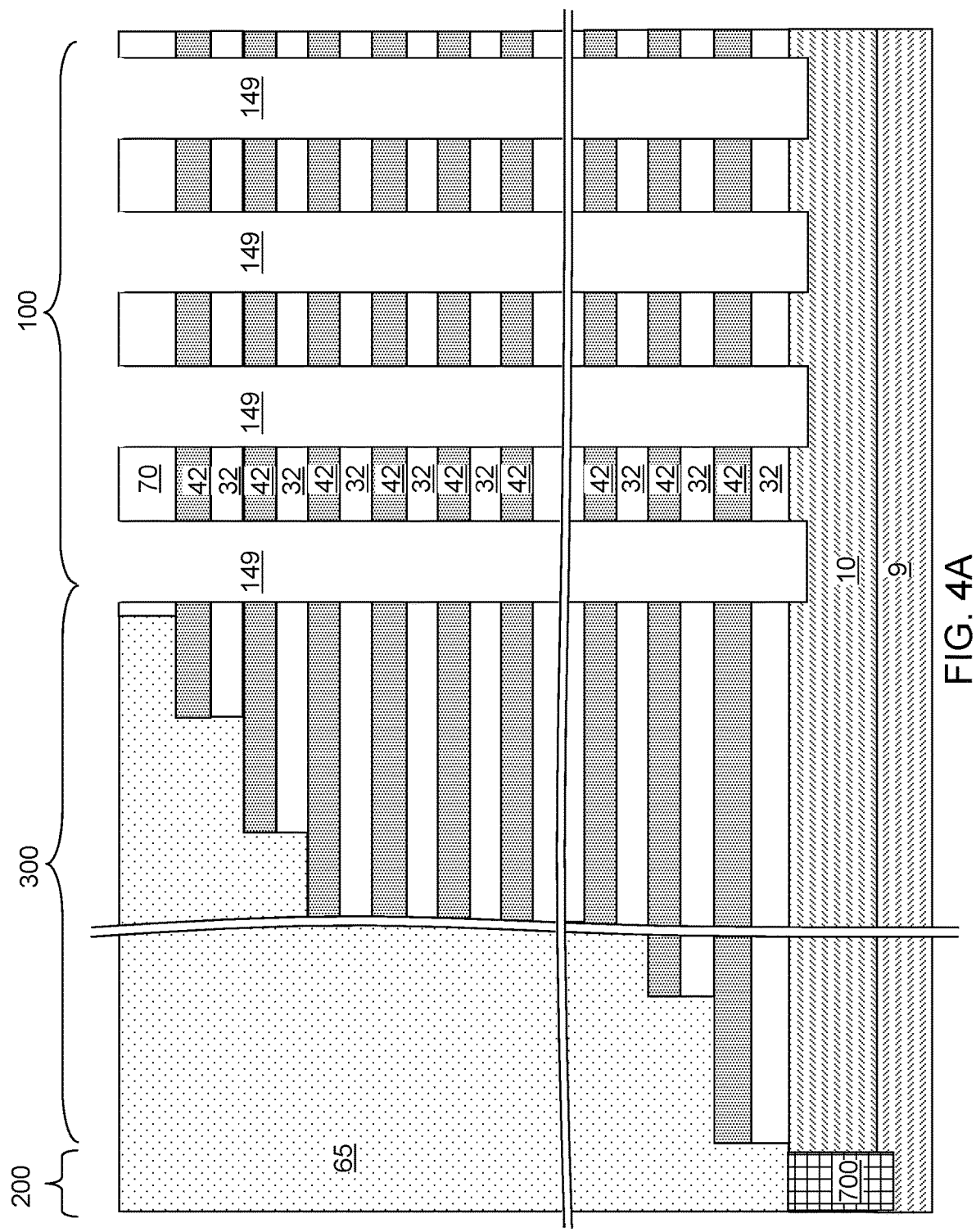

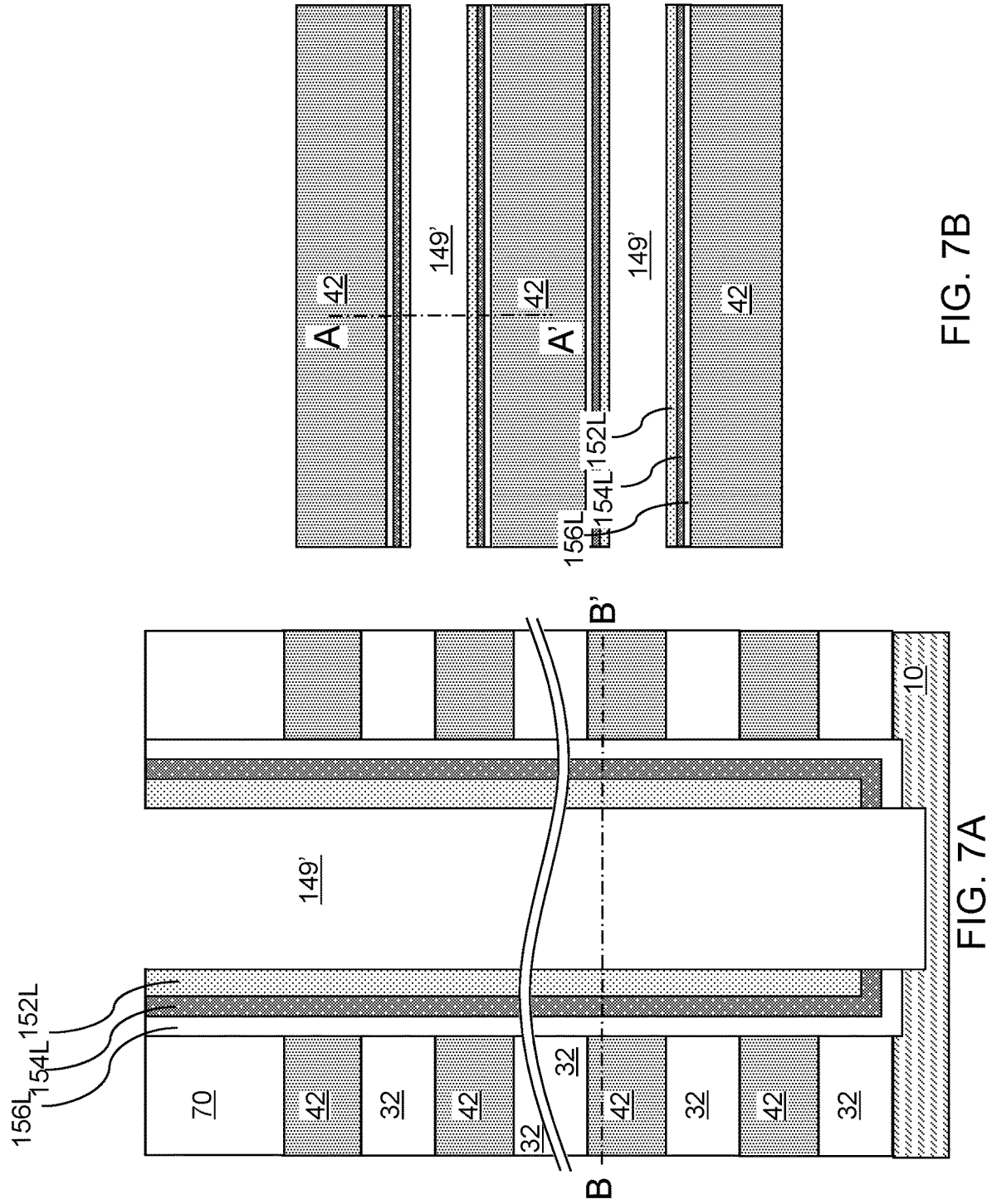

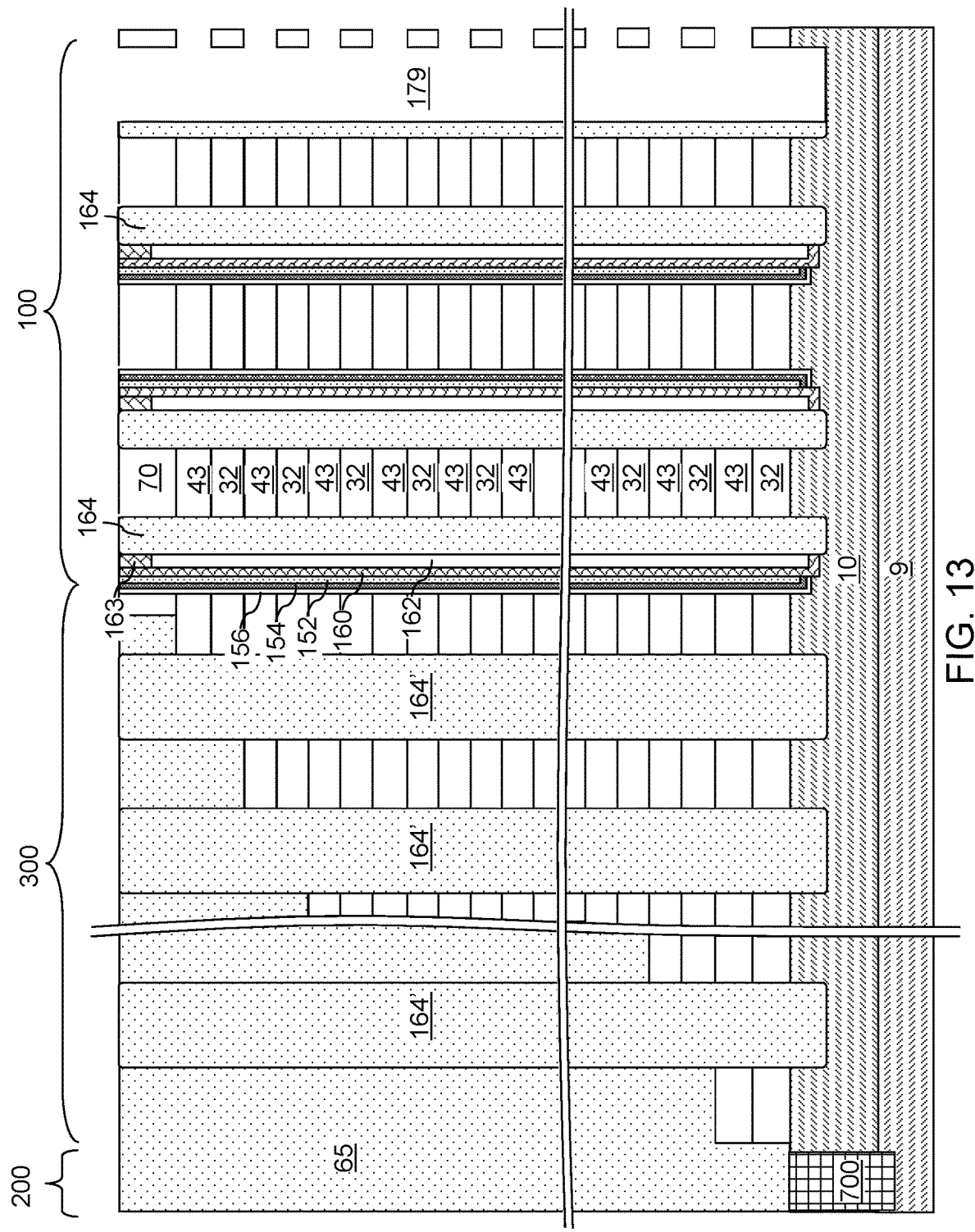

US 10,559,588 B2

THREE-DIMENSIONAL FLAT INVERSE NAND MEMORY DEVICE AND METHOD OF MAKING THE SAME

RELATED APPLICATIONS

The present application claims the benefit of priority from U.S. Provisional Application Ser. No. 62/616,584 filed on Jan. 12, 2018, the entire contents of which are incorporated herein by reference.

FIELD

The present disclosure relates generally to the field of semiconductor devices, and particular to a three-dimensional memory device including flat inverse NAND memory cells and methods of manufacturing the same.

BACKGROUND

A configuration of a three-dimensional NAND memory device employs flat memory cells in which tunneling dielectrics have flat vertical surfaces. Such flat memory device are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an aspect of the present disclosure, a three-dimensional memory device is provided, which comprises: alternating stacks of insulating strips and electrically conductive strips located over a substrate and laterally spaced apart among one another by line trenches, wherein the line trenches laterally extend along a first horizontal direction and are spaced apart along a second horizontal direction; and a two-dimensional array of memory stack structures and a two-dimensional array of dielectric pillar structures located in the line trenches, wherein each line trench is filled with a laterally alternating sequence of memory stack structures and dielectric pillar structures. Each memory stack structure comprises a vertical semiconductor channel, a pair of blocking dielectrics contacting outer sidewalls of the vertical semiconductor channel, a pair of charge storage layers contacting outer sidewalls of the pair of blocking dielectrics, a pair of tunneling dielectrics contacting outer sidewalls of the pair of charge storage layers, wherein each of the pair of tunneling dielectrics contacts sidewalls of each layer within a respective alternating stack of insulating strips and electrically conductive strips.

According to another aspect of the present disclosure, a method of forming a three-dimensional memory device comprises forming a vertically alternating sequence of insulating layers and spacer material layers over a substrate, forming line trenches laterally extending along a first horizontal direction through the vertically alternating sequence, forming line trench fill structures in the line trenches, and dividing the line trench fill structures by forming a two-dimensional array of dielectric pillar structures through the line trench fill structures, wherein remaining portions of the line trench fill structures comprise memory stack structures. Each line trench fill structure comprises a pair of tunneling dielectric sheets contacting remaining portions of the vertically alternating sequence, a pair of charge storage sheets contacting the pair of tunneling dielectric sheets, and a pair of blocking dielectric sheets contacting the pair of charge storage sheets, and a semiconductor channel material sheet located sidewalls of the pair of respective blocking dielectric sheets. The spacer material layers are formed as electrically conductive layers that are divided into electrically conductive strips upon formation of the line trenches, or are formed as sacrificial material layers that are replaced with electrically conductive strips.

BRIEF DESCRIPTION OF THE DRAWINGS

FIG. 4A is a schematic vertical cross-sectional view of the exemplary structure after formation of line trenches according to an embodiment of the present disclosure.

FIG. 7A is a vertical cross-sectional view of a line trench after formation of a pair of tunneling dielectric sheets, a pair of charge storage sheets, and a pair of blocking dielectric sheets within each line trench by performing an anisotropic etch process according to an embodiment of the present disclosure.

FIG. 7B is a horizontal cross-sectional view along the plane B-B' of FIG. 7A.

FIG. 13 is a schematic vertical cross-sectional view of the exemplary structure after formation of backside recesses according to an embodiment of the present disclosure.

DETAILED DESCRIPTION

Figure 1:
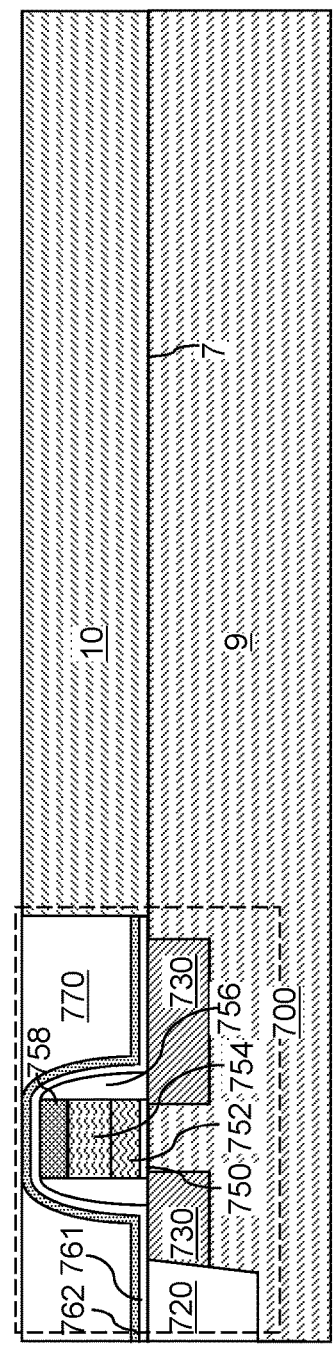
FIG. 1 is a schematic vertical cross-sectional view of an exemplary structure after formation of at least one peripheral device, a semiconductor material layer, and a gate dielectric layer according to an embodiment of the present disclosure.

The present inventors realized that prior art flat memory cells described in the Lue et al. article are inherently more difficult to program and more difficult to erase than cylindrical memory cells with surrounding gate electrodes because the gate electrodes do not provide an encircling configuration. The threshold voltage window, which is the voltage difference between the erase threshold voltage and the program threshold voltage, tends to be narrow, and thus, is not amenable to formation of multibit per cell memory devices. Further, it is more difficult to obtain a high boosting potential for prior art flat memory cells than for cylindrical memory cells due to a flat cell shape, which provides less coupling between the gate electrodes and the semiconductor channel, and due to the impact of the lower channel boosting potential in the neighboring portion of the semiconductor channel for each cell.

In view of the above, embodiments of the present disclosure provide improved flat memory cell having an inverse configuration in which the tunneling dielectric is located adjacent to the control gate electrode and the blocking dielectric is located adjacent to the semiconductor channel. In one embodiment, the inverse flat memory provides a wider programming window and a wider erase window than prior art flat memory cells. Thus, the embodiments of the present disclosure are directed to three-dimensional memory devices including device including flat inverse NAND memory cells and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770. In one embodiment, the semiconductor material layer 10 can have a doping of a first conductivity type.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
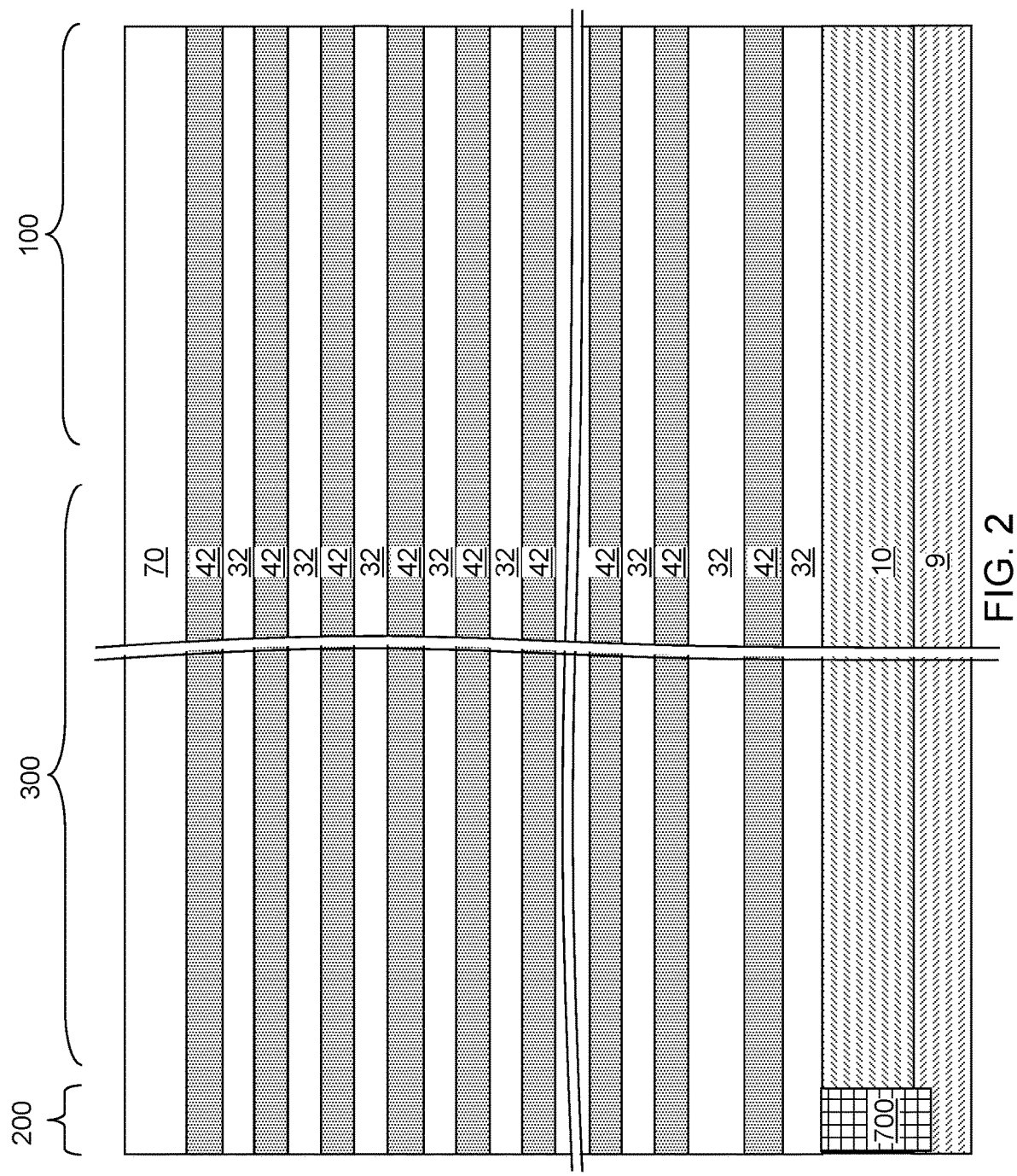
FIG. 2 is a schematic vertical cross-sectional view of the exemplary structure after formation of a vertically alternating sequence of insulating layers and spacer material layers according to an embodiment of the present disclosure.

Referring to FIG. 2, a vertically alternating sequence of first material layers (such as insulating layers 32) and second material layers (such as spacer material layers) is formed over the substrate (9, 10). As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32) and second material layers (which can be sacrificial material layer 42). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

In one embodiment, the vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the vertically alternating sequence (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the vertically alternating sequence (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
FIG. 3 is a schematic vertical cross-sectional view of the exemplary structure after formation of stepped terraces and a retro-stepped dielectric material portion according to an embodiment of the present disclosure.
Figure 4B:
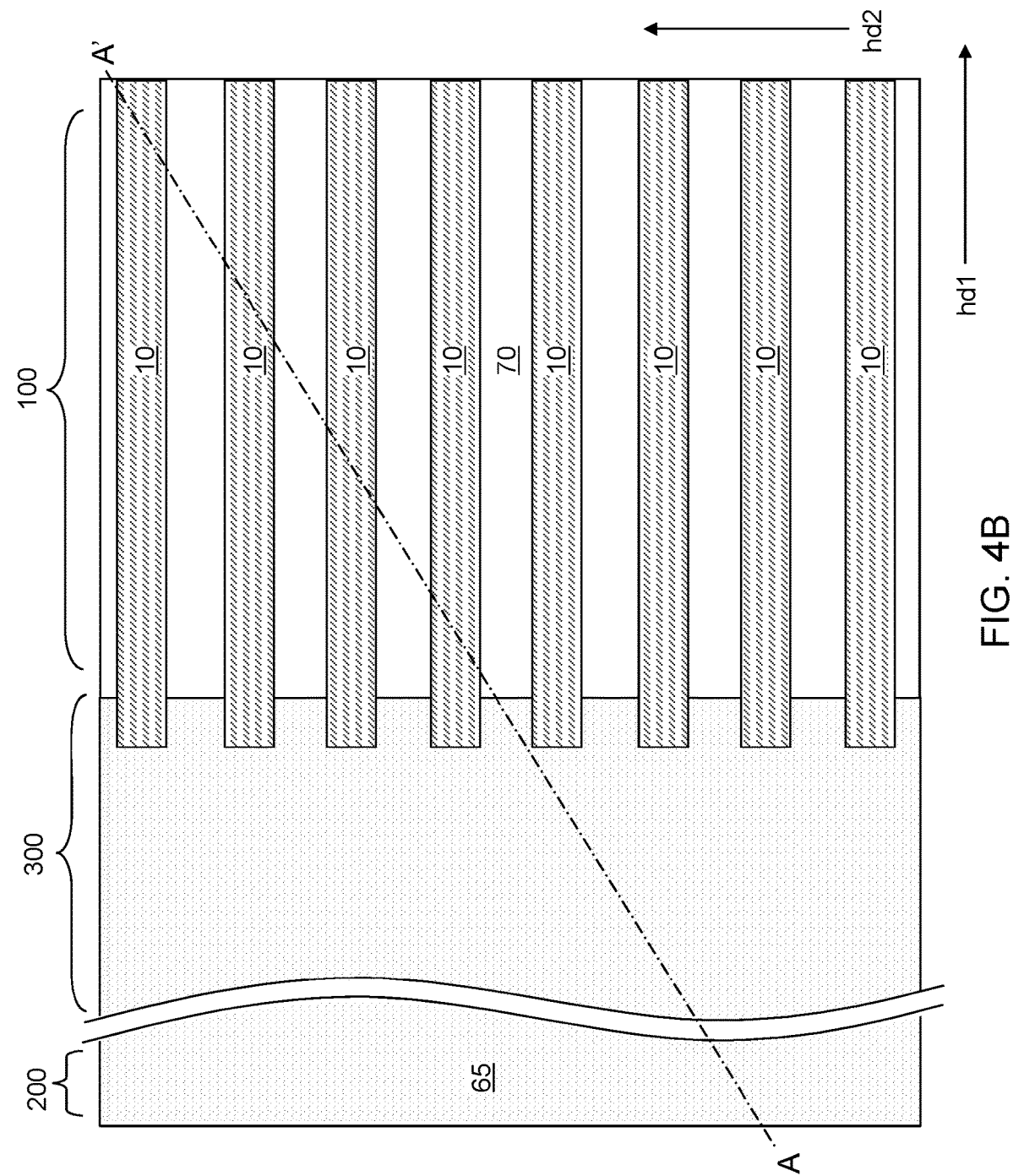
FIG. 4B is a top-down view of the exemplary structure of FIG. 4A. The vertical plane A-A' is the plane of the cross-section for FIG. 4A.
Figure 5B:
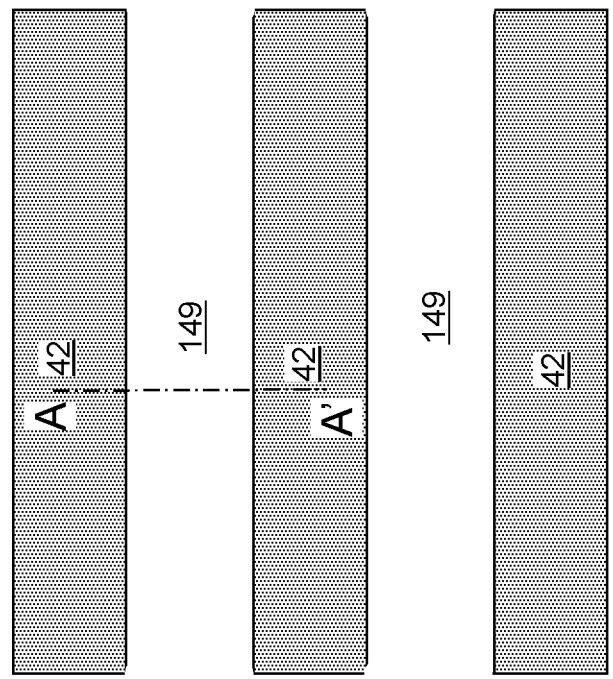
FIG. 5B is a horizontal cross-sectional view along the plane B-B' of FIG. 5A.
Figure 5A:
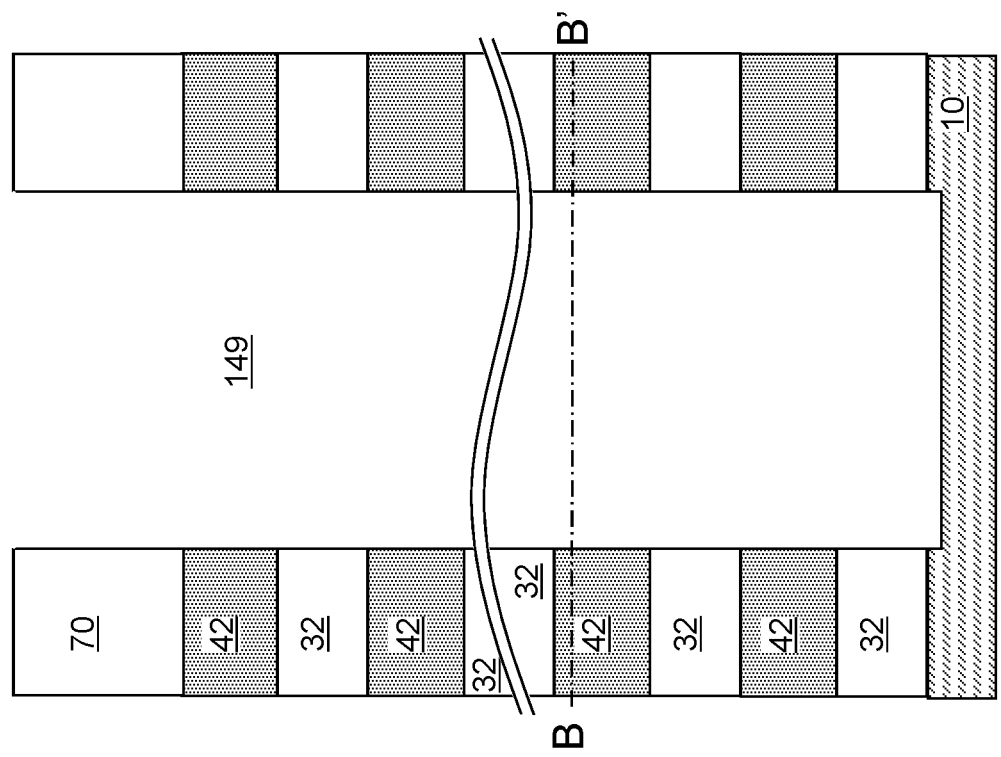
FIG. 5A is a vertical cross-sectional view of a line trench in the exemplary structure of FIGS. 4A and 4B.

Referring to FIG. 3, the vertically alternating sequence of the insulating layers 32 and the spacer material layers (i.e., the sacrificial material layers 42) can be patterned to form stepped surfaces that continuously extend from a bottommost layer of the vertically alternating sequence (32, 42) to a topmost layer of the alternating sequence (32, 42) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the insulating cap layer 70 and the retro-stepped dielectric material portion 65, and can be lithographically patterned to form line-shaped openings therein. The line-shaped openings laterally extend along a first horizontal direction hd1, and has a uniform width along a second horizontal direction hd2 that is perpendicular to the first horizontal direction hd1. The pattern in the lithographic material stack can be transferred through the insulating cap layer 70 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the line-shaped openings in the patterned lithographic material stack are etched to form line trenches 149. As used herein, a "line trench" refers to a trench that has laterally extends straight along a horizontal direction.

The line trenches 149 laterally extend along the first horizontal direction hd1 through the vertically alternating sequence (32, 42). In one embodiment, the line trenches 149 have a respective uniform width that is invariant under translation along the first horizontal direction hd1. In one embodiment, the line trenches 149 can have the same width throughout, and the spacing between neighboring pairs of the line trenches 149 can be the same. In this case, the line trenches 149 can constitute a one-dimensional periodic array of line trenches 149 having a pitch along a second horizontal direction hd2 that is perpendicular to the first horizontal direction hd1. The width of the line trenches 149 along the second horizontal direction hd2 can be in a range from 30 nm to 500 nm, such as from 60 nm to 250 nm, although lesser and greater widths can also be employed.

The line trenches 149 extend through each layer of the vertically alternating sequence (32, 42) and the retro-stepped dielectric material portion 65. The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 149 can be substantially vertical, or can be tapered. The patterned lithographic material stack can be subsequently removed, for example, by ashing.

The line trenches 149 laterally extend through the entire memory array region 100, and laterally extend into the contact region 300. The line trenches 149 may laterally extend through the entire contact region 300 along the first horizontal direction hd1, or may laterally extend only through part of a width, but not the entire width along the first horizontal direction hd1, of the contact region 300. In one embodiment, an overetch into the semiconductor material layer 10 may be optionally performed after the top surface of the semiconductor material layer 10 is physically exposed at a bottom of each line trench 149. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches 149 can be coplanar with the topmost surface of the semiconductor material layer 10.

Each of the line trenches 149 may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. Alternatively, the semiconductor material layer 10 may be omitted, and the line trenches 149 can be extend to a top surface of the substrate semiconductor layer 9.

Figure 6B:
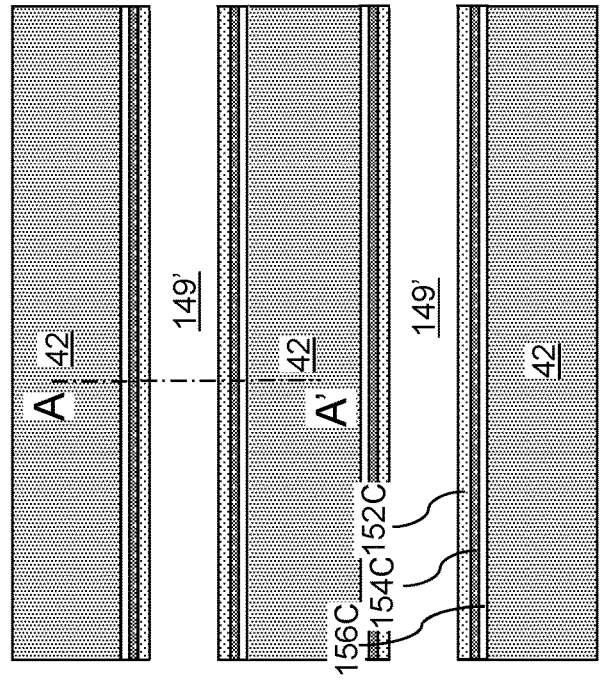
FIG. 6B is a horizontal cross-sectional view along the plane B-B' of FIG. 6A.
Figure 6A:
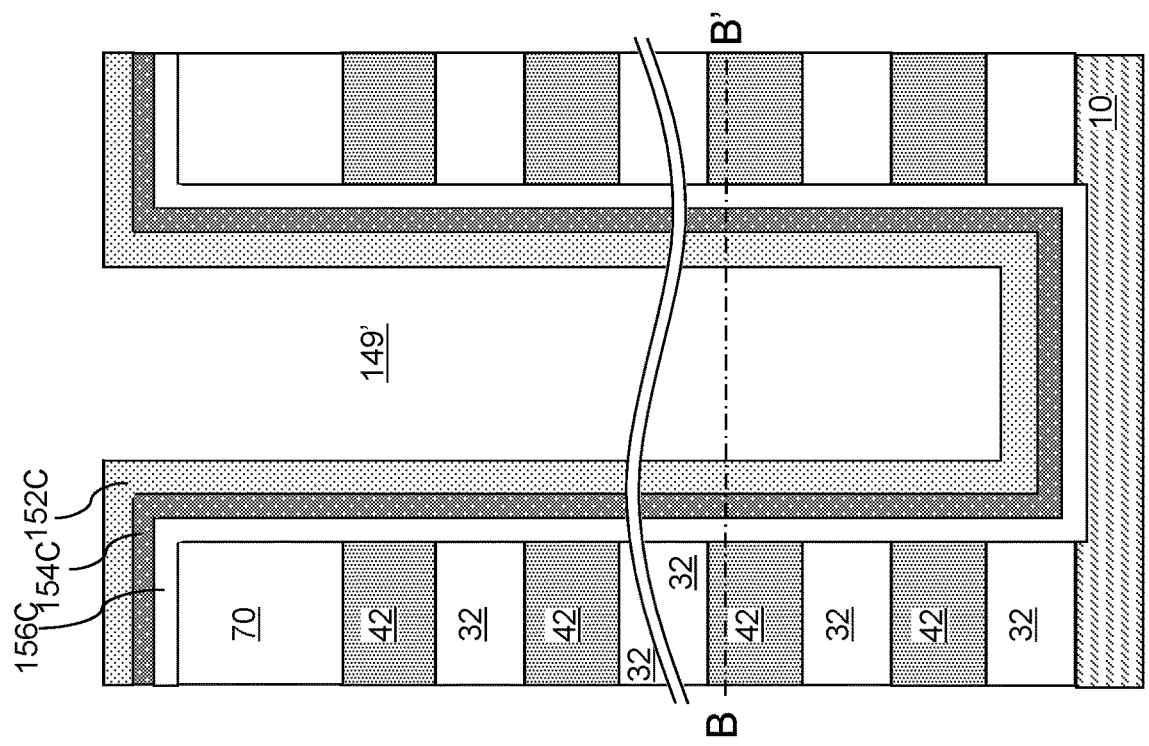
FIG. 6A is a vertical cross-sectional view of a line trench after formation of a continuous tunneling dielectric sheet, a continuous charge storage sheet, and a continuous blocking dielectric sheet according to an embodiment of the present disclosure.

Referring to FIGS. 6A and 6B, a continuous tunneling dielectric material layer 156C, a continuous charge storage material layer 154C, and a continuous blocking dielectric material layer 152C are sequentially formed in the line trenches 149 and over the insulating cap layer 70.

The continuous tunneling dielectric material layer 156C is formed directly on sidewalls and bottom surfaces of the line trenches 149 by a conformal deposition process. The continuous tunneling dielectric material layer 156C includes a dielectric material through which charge tunneling can be performed under suitable electrical bias conditions. The charge tunneling may be performed by Fowler-Nordheim tunneling. The continuous tunneling dielectric material layer 156C can include silicon oxide, silicon nitride, silicon oxynitride, dielectric metal oxides (such as aluminum oxide or hafnium oxide), dielectric metal oxynitride, dielectric metal silicates, alloys thereof, and/or combinations thereof. In one embodiment, the continuous tunneling dielectric material layer 156C can include a stack of a first silicon oxide layer, a silicon oxynitride layer, and a second silicon oxide layer, which is commonly known as an ONO stack. In one embodiment, the continuous tunneling dielectric material layer 156C can include a silicon oxide layer that is substantially free of carbon or a silicon oxynitride layer that is substantially free of carbon. The thickness of the continuous tunneling dielectric material layer 156C can be in a range from 2 nm to 20 nm, although lesser and greater thicknesses can also be employed.

The continuous tunneling dielectric material layer 156C can have a uniform thickness, which is herein referred to as a tunneling dielectric thickness $d_t$. The continuous tunneling dielectric material layer 156C has an effective dielectric constant, which is herein referred to as a tunneling dielectric constant $\varepsilon_t$. In case the continuous tunneling dielectric material layer 156C includes multiple component layers, the tunneling dielectric constant $\varepsilon_t$ is defined by the following equation:

$$\frac{d_t}{\varepsilon_t} = \sum_{i=1}^{N} \frac{d_{ti}}{\varepsilon_{ti}},$$

in which the continuous tunneling dielectric material layer 156C has N component dielectric layers, $d_{ti}$ is the thickness of the i-th component dielectric layer, and $\varepsilon_{ti}$ is the dielectric constant of the i-th component dielectric layer. The ratio of the tunneling dielectric constant $\varepsilon_t$ to the tunneling dielectric thickness $d_t$ is the capacitance per unit area of a capacitor including a pair of electrodes separated by the continuous tunneling dielectric material layer 156C.

Subsequently, the continuous charge storage material layer 154C can be formed. In one embodiment, the continuous charge storage material layer 154C can be a dielectric charge trapping material, which can be, for example, silicon nitride. The continuous charge storage material layer 154C can be formed, for example, by chemical vapor deposition (CVD), atomic layer deposition (ALD), physical vapor deposition (PVD), or any suitable deposition technique for storing electrical charges therein. The thickness of the continuous charge storage material layer 154C can be in a range from 2 nm to 20 nm, although lesser and greater thicknesses can also be employed.

The continuous blocking dielectric material layer 152C can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric material layer 152C can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to the semiconductor channels. In one embodiment, the continuous blocking dielectric material layer 152C includes hafnium oxide or aluminum oxide. In one embodiment, the continuous blocking dielectric material layer 152C can include multiple dielectric metal oxide layers having different material compositions.

Alternatively or additionally, the continuous blocking dielectric material layer 152C can include a dielectric semiconductor compound such as silicon oxide, silicon oxynitride, silicon nitride, or a combination thereof. In one embodiment, the continuous blocking dielectric material layer 152C can include silicon oxide or a combination of silicon oxide and hafnium oxide. In this case, the dielectric semiconductor compound of the continuous blocking dielectric material layer 152C can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The continuous blocking dielectric material layer 152C can have a uniform thickness, which is herein referred to as a blocking dielectric thickness $d_b$. The continuous blocking dielectric material layer 152C has an effective dielectric constant, which is herein referred to as a blocking dielectric constant $\varepsilon_b$. In case the continuous blocking dielectric material layer 152C includes multiple component layers, the blocking dielectric constant $\varepsilon_b$ is defined by the following equation:

$$\frac{d_b}{\varepsilon_b} = \sum_{i=1}^{M} \frac{d_{bi}}{\varepsilon_{bi}},$$

in which the continuous blocking dielectric material layer 152C has M component dielectric layers, $d_{bi}$ is the thickness of the i-th component dielectric layer, and $\varepsilon_{bi}$ is the dielectric constant of the i-th component dielectric layer. The ratio of the blocking dielectric constant $\varepsilon_b$ to the blocking dielectric thickness $d_b$ is the capacitance per unit area of a capacitor including a pair of electrodes separated by the continuous blocking dielectric material layer 152C.

According to an aspect of the present disclosure, the ratio of the blocking dielectric constant $\varepsilon_b$ to the blocking dielectric thickness $d_b$ is greater than a ratio of the tunneling dielectric constant $\varepsilon_t$ to the tunneling dielectric thickness $d_t$. Thus, the capacitance per unit area of a planar capacitor employing the continuous blocking dielectric material layer 152C as a capacitor dielectric is greater than the capacitance per unit area of a planar capacitor employing the continuous tunneling dielectric material layer 156C as a capacitor dielectric, and charge tunneling occurs through the continuous tunneling dielectric material layer 156C at a lower voltage bias than through the continuous blocking dielectric material layer 152C. A line cavity 149' is present within each line cavity 149.

Referring to FIGS. 7A and 7B, the continuous blocking dielectric material layer 152C, the continuous charge storage material layer 154C, and the continuous tunneling dielectric material layer 156C can be sequentially anisotropically etched employing at least one anisotropic etch process. The portions of the continuous blocking dielectric material layer 152C, the continuous charge storage material layer 154C, and the continuous tunneling dielectric material layer 156C located above the top surface of the insulating cap layer 70 can be removed by the at least one anisotropic etch process. Further, the horizontal portions of the continuous blocking dielectric material layer 152C, the continuous charge storage material layer 154C, and the continuous tunneling dielectric material layer 156C at a bottom of each line cavity 149' can be removed to form linear openings. Each of the continuous blocking dielectric material layer 152C, the continuous charge storage material layer 154C, and the continuous tunneling dielectric material layer 156C can be etched by a respective anisotropic etch process employing a respective etch chemistry, which may, or may not, be the same for the various material layers.

Each remaining portion of the continuous blocking dielectric material layer 152C constitutes a blocking dielectric sheet 152L. Each remaining portion of the continuous charge storage material layer 154C constitutes a charge storage sheet 154L. Each remaining portion of the continuous tunneling dielectric material layer 156C constitutes a tunneling dielectric sheet 156L. Each of the blocking dielectric sheets 152L, the charge storage sheets 154L, and the tunneling dielectric sheets 156L can include a pair of lengthwise sidewalls that laterally extend along the first horizontal direction hd1 and a pair of widthwise sidewalls that laterally extend along the second horizontal direction hd2.

Each blocking dielectric sheet 152L can have a uniform thickness that is the blocking dielectric thickness $d_b$ and an effective dielectric constant that is the blocking dielectric constant $\varepsilon_b$. Each tunneling dielectric sheet 156L has a uniform thickness that is the tunneling dielectric thickness $d_t$ and an effective dielectric constant that is the tunneling dielectric constant $\varepsilon_t$.

Figure 8B:
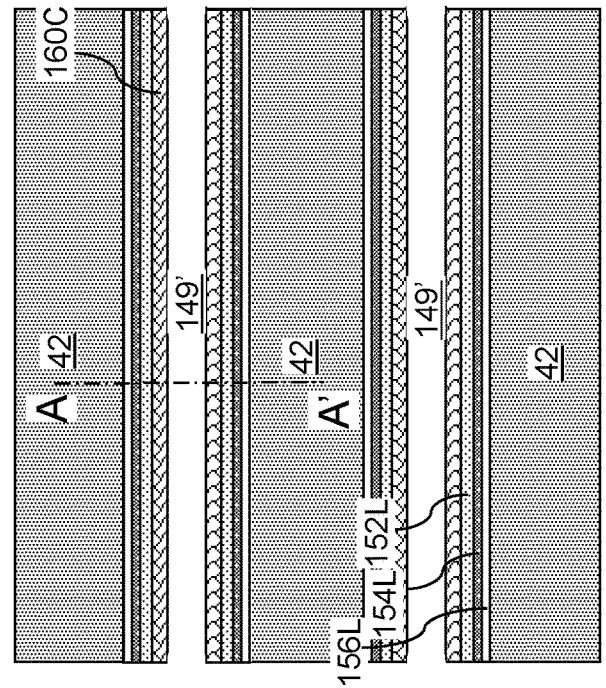
FIG. 8B is a horizontal cross-sectional view along the plane B-B' of FIG. 8A.
Figure 8A:
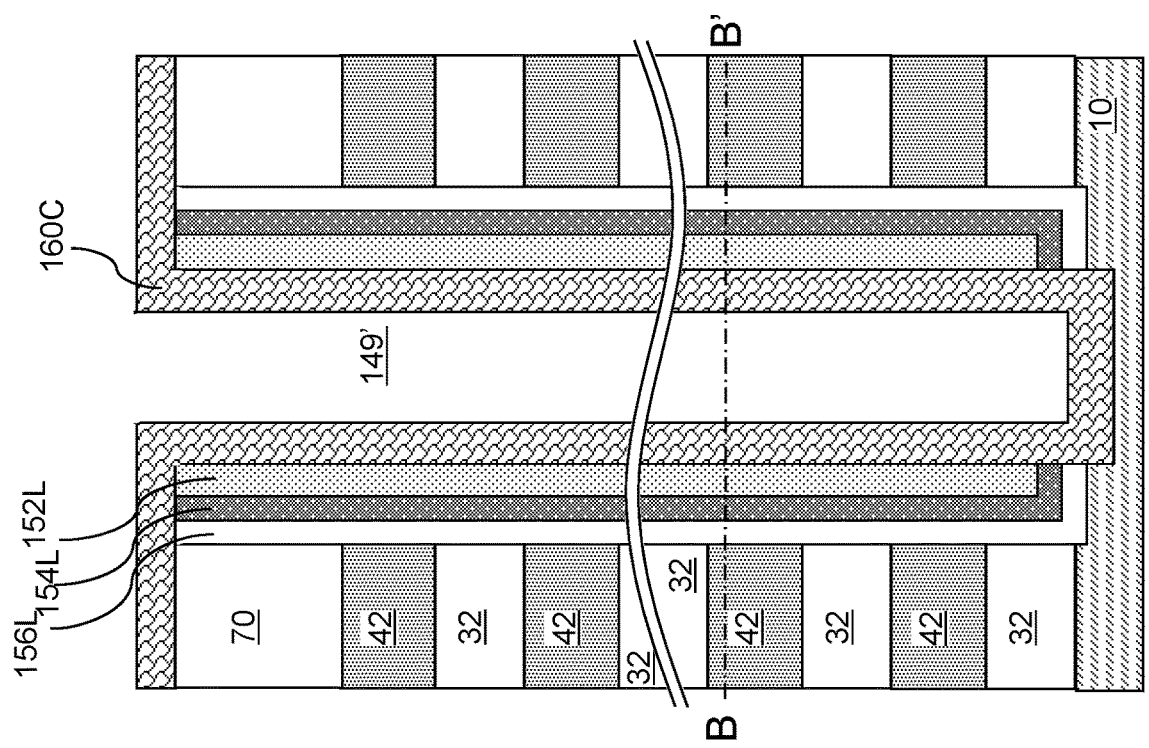
FIG. 8A is a vertical cross-sectional view of a line trench after formation of a continuous semiconductor channel material layer according to an embodiment of the present disclosure.

Referring to FIGS. 8A and 8B, a continuous semiconductor channel material layer 160C can be deposited directly on the semiconductor surfaces of the semiconductor material layer 10, and directly on the blocking dielectric sheets 152L. The continuous semiconductor channel material layer 160C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the continuous semiconductor channel material layer 160C includes amorphous silicon or polysilicon. The continuous semiconductor channel material layer 160C can be formed by a conformal deposition method such as low pressure chemical vapor deposition (LPCVD). The thickness of the continuous semiconductor channel material layer 160C can be in a range from 2 nm to 10 nm, although lesser and greater thicknesses can also be employed. In one embodiment, the continuous semiconductor channel material layer 160C can have a doping of the first conductivity type, which is the same conductivity type as the conductivity type of the doping of the semiconductor material layer 10. In one embodiment, the continuous semiconductor channel material layer 160C can comprise a semiconducting material including electrical dopants at an atomic concentration in a range from $1.0 \times 10^{14}/cm^3$ to $1.0 \times 10^{18}/cm^3$.

Figure 9A:
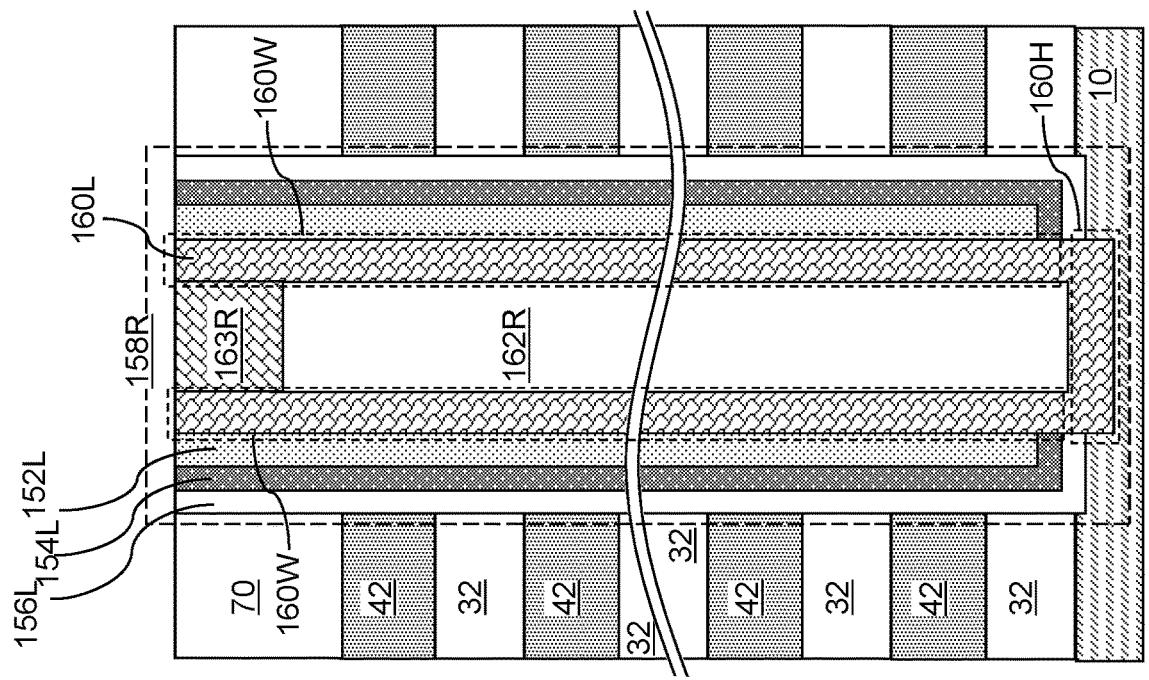
FIG. 9A is a vertical cross-sectional view of a line trench after formation of a semiconductor channel material sheet, a dielectric core rail, and a drain region rail in the line trench according to an embodiment of the present disclosure.
Figure 9B:
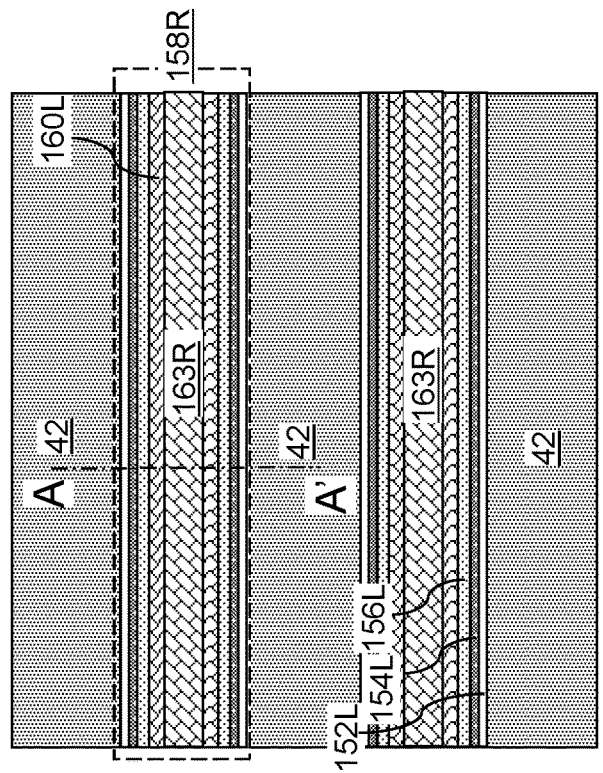
FIG. 9B is a horizontal cross-sectional view along the plane B-B' of FIG. 9A.

Referring to FIGS. 9A and 9B, a dielectric fill material such as silicate glass can be deposited in the line cavities 149' by a conformal deposition process. The dielectric fill material can be deposited, for example, by low pressure chemical vapor deposition process. The dielectric fill material fills the line trenches 149' and is deposited over horizontal portions of the continuous semiconductor channel material layer 160C that overlie the insulating cap layer 70. The dielectric fill material can be vertically recessed, for example, by a recess etch so that portions of the dielectric fill material overlying the horizontal portions of the continuous semiconductor channel material layer 160C that overlie the insulating cap layer 70 is removed. The dielectric fill material is further vertically recessed selective to the material of the continuous semiconductor channel material layer 160C such that remaining portions of the dielectric fill material has a top surface between the horizontal plane including the top surface of the insulating cap layer 70 and the horizontal plane including the bottom surface of the insulating cap layer 70. Each remaining portion of the dielectric fill material constitutes a dielectric rail 162R. As used herein, a "rail" or a "rail structure" refers to an elongated structure that laterally extends along a horizontal direction (which is a "lengthwise" direction).

A doped semiconductor material having a doping of a second conductivity type is formed in voids that overlie the dielectric rails 162R. The second conductivity type is the opposite of the first conductivity type. The doped semiconductor material can include electrical dopants of the second conductivity type at an atomic concentration in a range from $5.0 \times 10^{19}/cm^3$ to $1.0 \times 10^{21}/cm^3$. Portions of the deposited doped semiconductor material of the second conductivity type and portions of the continuous semiconductor channel material layer 160C that overlie the horizontal plane including the top surface of the insulating cap layer 70 can be removed by a planarization process, which can be a recess etch that etches the semiconductor materials selective to the dielectric material of the insulating cap layer 70 or a chemical mechanical planarization (CMP) process. Each remaining portion of the doped semiconductor material of the second conductivity type constitutes a drain region rail 163R, which is subsequently divided into a plurality of drain regions. Each remaining portion of the continuous semiconductor channel material layer 160C after the planarization process constitutes a semiconductor channel material sheet 160L.

The set of all material portions filling a line trench constitutes a line trench fill structure 158R, which can include a pair of tunneling dielectric sheets 156L, a pair of charge storage sheets 154L, a pair of blocking dielectric sheets 152L, a semiconductor channel material sheet 160L, a dielectric core rail 162R, and a drain region rail 163R. A contiguous set of a tunneling dielectric sheet 156L, a charge storage sheet 154L, a blocking dielectric sheet 152L is herein referred to as a memory film sheet (152L, 154L, 156L). Each tunneling dielectric sheet 156L contacts remaining portions of the vertically alternating sequence (32, 42) after formation of the line trenches 149. Each charge storage sheet 154L contacts a respective tunneling dielectric sheet 156L. Each blocking dielectric sheet 152L contacts a respective charge storage sheet 154L. Each semiconductor channel material sheet 160L is formed on sidewalls of a respective blocking dielectric sheet 152L.

Each semiconductor channel material sheet 160L can be formed with a U-shaped vertical cross-sectional profile. In one embodiment, each semiconductor channel material sheet 160L can include a pair of vertically extending wing portions 160W that laterally extend along the first horizontal direction hd1 and a horizontal connecting portion 160H that is adjoined to bottom regions of the pair of vertically extending wing portions 160W. A stack of a dielectric core rail 162R and a drain region rail 163R can be formed within each semiconductor channel material sheet 160L.

Referring to FIGS. 10A-10D, a photoresist layer (not shown) can be applied over the exemplary structure, and can be lithographically patterned to form rows of openings that overlie the line trench fill structures 158R. Further, elongated openings can be formed in the portion of the photoresist layer located in the contact region 300. The elongated openings overlie portions of the line trench fill structures 158R in the contact region 300 and/or are formed in areas corresponding to extensions of the line trench fill structures 158R into the contact region 300 along the first horizontal direction hd1.

An anisotropic etch is performed employing the patterned photoresist layer as an etch mask. Unmasked portions of the line trench fill structures 158R, the vertically alternating sequence (32, 42), and the retro-stepped dielectric material portion 65 are etched through by the anisotropic etch process. The anisotropic etch process can be a reactive ion etch process that indiscriminately etches the materials of the line trench fill structures 158R, the vertically alternating sequence (32, 42), and the retro-stepped dielectric material portion 65. End point detection can be effected by sensing of physical exposure of the surfaces of the semiconductor material layer 10.

Discrete via cavities 69 (also referred to as "pillar cavities") are formed in rows that overlap with the areas of the line trench fill structures 158R. The discrete via cavities 69 can have substantially vertical sidewalls, and laterally divide each line trench fill structure 158R into memory pillar structures 158. In one embodiment, the discrete via cavities 69 can be formed as a two-dimensional array of via cavities 69 extending through the line trench fill structures 158R. Each of the via cavities 69 extends to the substrate (9, 10) and sidewalls of remaining portions of the insulating layers 32 and the spacer material layers (i.e., the sacrificial material layers 42) are physically exposed around the via cavities 69. The line trenches 149 can be modified by the via cavities 69 and the elongated via cavities 69'. For example, sidewalls of the line trenches 149 can have lateral undulation in case the widths of the via cavities 69 and the elongated via cavities 69' are greater than the initial width of the line trenches as formed at the processing steps of FIGS. 4A and 4B.

Each memory pillar structure 158 is a patterned portion of a line trench fill structure 158R, and includes a pair of tunneling dielectrics 156 that are patterned portions of a pair of tunneling dielectric sheets 156L, a pair of charge storage layers 154 that are patterned portions of a pair of charge storage sheets 154L, and a pair of blocking dielectrics 152 that are patterned portions of a pair of blocking dielectric sheets 152L. Each contiguous set of a tunneling dielectric 156, a charge storage layer 154, and a blocking dielectric 152 constitutes a memory film 150. A memory stack structure 155 includes a U-shaped vertical semiconductor channel 160 which contacts a pair of memory films 150 located within the memory pillar structure 158. Each memory pillar structure 158 can include a dielectric core 162 which is a patterned portion of a dielectric core rail 162R and a drain region 163 which is a patterned portion of a drain region rail 163R. Each dielectric core rail 162R and each drain region rail 163R can be divided into a plurality of dielectric cores 162 and a plurality of drain regions 163 upon dividing the line trench fill structures 158R with the discrete via cavities 69. In one embodiment, each blocking dielectric 152 comprises hafnium oxide layer or a combination of silicon oxide and hafnium oxide layers, each charge storage layer 154 comprises silicon nitride, and each tunneling dielectric 156 comprises a silicon oxide layer or a stack of silicon oxide, silicon oxynitride and silicon oxide layers.

Elongated via cavities 69' can be formed in the contact region 300 such that the combination of the elongated via cavities 69', the memory pillar structures 158, and the discrete via cavities 69 collectively divide the vertical alternating sequence (32, 42) of insulating layers 32 and sacrificial material layers 42 into multiple discrete portions that are laterally divided along the second horizontal direction hd2. Each patterned portion of the insulating layers 32 has a strip shape that has the first horizontal direction hd1 as a lengthwise direction and the second horizontal direction hd2 as a widthwise direction. Thus, each patterned portion of the insulating layers 32 is herein referred to as an insulating strip 32. Likewise, each patterned portion of the sacrificial material layers 42 has a strip shape that has the first horizontal direction hd1 as a lengthwise direction and the second horizontal direction hd2 as a widthwise direction. Thus, each patterned portion of the sacrificial material layers 42 is herein referred to as a sacrificial material strip 32.

Each set of vertically neighboring insulating strips 32 and sacrificial material strips 42 constitutes an alternating stack of the insulating strips 32 and the sacrificial material strips 42. Thus, each divided portion of the vertical alternating sequence (32, 42) of insulating layers 32 and sacrificial material layers 42 constitutes an alternating stack (32, 42) of insulating strips 32 and sacrificial material strips 42.

Referring to FIGS. 11A-11D, a dielectric material such as a doped silicate glass, undoped silicate glass, or organosilicate glass can be deposited in the discrete via cavities 69 and the elongated via cavities 69' by a conformal deposition process or a non-conformal deposition process. For example, low pressure chemical vapor deposition (LPCVD), sub-atmospheric chemical vapor deposition (SACVD), and/or plasma enhanced chemical vapor deposition (PECVD) can be employed to deposit the dielectric material that fills the discrete via cavities 69 and the elongated via cavities 69' at least partially, i.e., with, or without, voids therein. Excess portions of the deposited dielectric material can be removed from above the top surfaces of the insulating cap layer 70 and the retro-stepped dielectric material portion 65 by a planarization process, which can include chemical mechanical planarization (CMP) and/or a recess etch. Each remaining portion of the deposited dielectric material in the discrete via cavities 69 constitutes a dielectric pillar structure 164. Each remaining portion of the deposited dielectric material in the elongated via cavities 69' constitutes a dielectric wall structure 164'.

A two-dimensional array of dielectric pillar structures 164 can be formed in the discrete via cavities 69, which divide the line trench fill structures 158R into memory pillar structures 158. Generally, the two-dimensional array of dielectric pillar structures 164 can be formed by depositing a dielectric fill material in the via cavities 69 and by planarizing the dielectric fill material from above the topmost layer of the vertically alternating sequence (32, 42), i.e., from above the topmost layers of the alternating stacks (32, 42). If the insulating cap layer 70 is employed, the top surface of the insulating cap layer 70 can be employed as a planarization surface. Remaining portions of the dielectric fill material constitute the two-dimensional array of dielectric pillar structures 164. Each memory stack structure 155 comprises a vertical semiconductor channel 160 that is a patterned portion of a respective semiconductor channel material sheet 160L, a pair of blocking dielectrics 152 that are patterned portions of a pair of respective blocking dielectric sheets 152L, a pair of charge storage layers 154 that are patterned portions of a respective pair of charge storage sheets 154L, a pair of tunneling dielectrics 156 that are patterned portions of a respective pair of tunneling dielectric sheets 156L, and a vertical semiconductor channel 160 that is a patterned portion of a respective semiconductor channel material sheet 160L.

Each dielectric pillar structure 164 can have a maximum dimension along the second horizontal direction hd2 that is at least the width of the line trench 149 through which the dielectric pillar structure 164 extends. In one embodiment, each dielectric pillar structure 164 can have a pair of first sidewalls that contact a pair of alternating stacks (32, 42) of insulating strips 32 and sacrificial material strips 42. In one embodiment, one or more of the dielectric pillar structures 164 can include a pair of second sidewalls that contact sidewalls of a pair of memory pillar structures 158. In one embodiment, the first sidewalls and the second sidewalls can have vertical planar portions (i.e., portions contained within a respective two-dimensional Euclidean plane), and may include curved vertical portions that can be concave vertical portions.

Figure 12A:
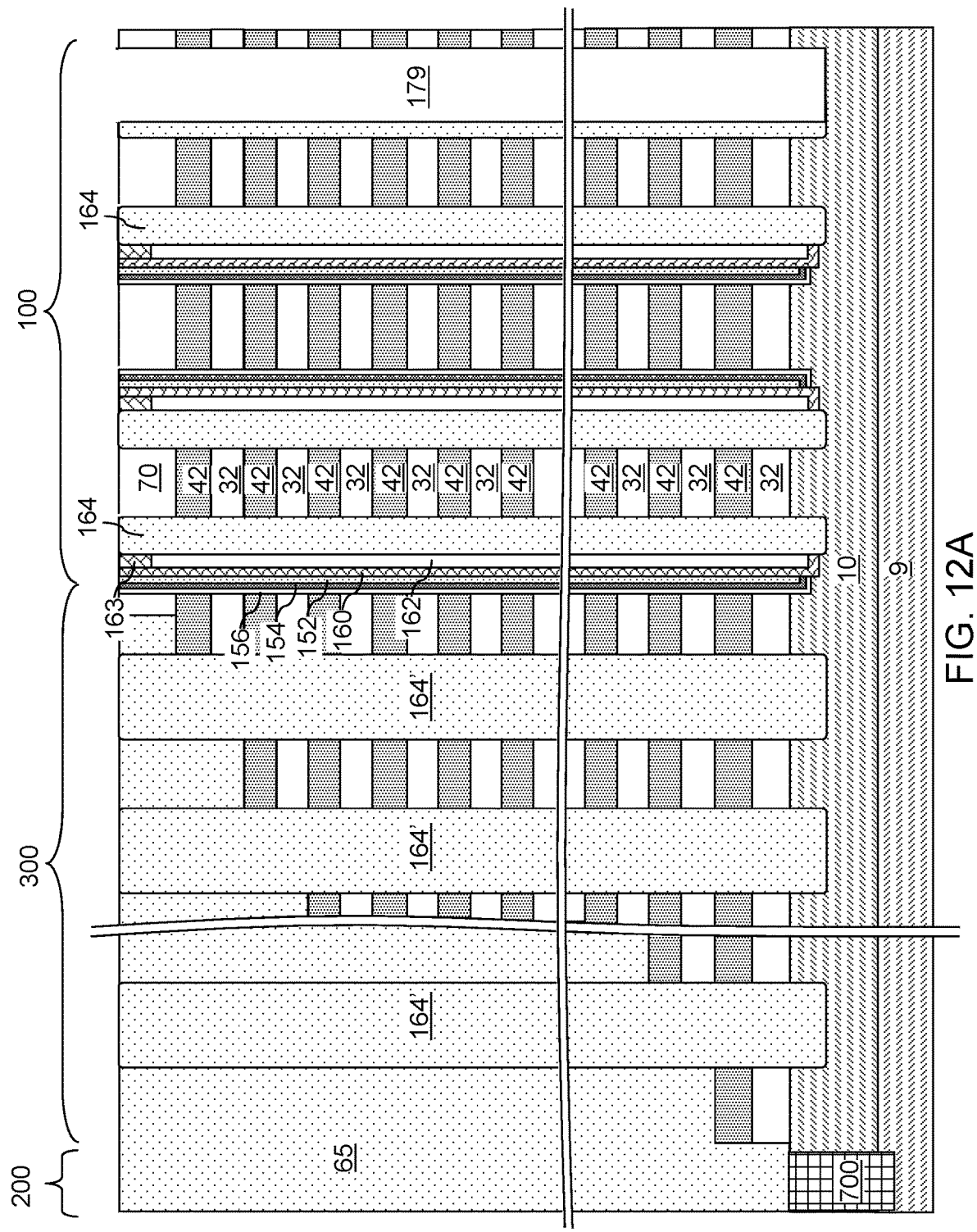
FIG. 12A is a vertical cross-sectional view of the exemplary structure after formation of backside via cavities according to an embodiment of the present disclosure.
Figure 12B:
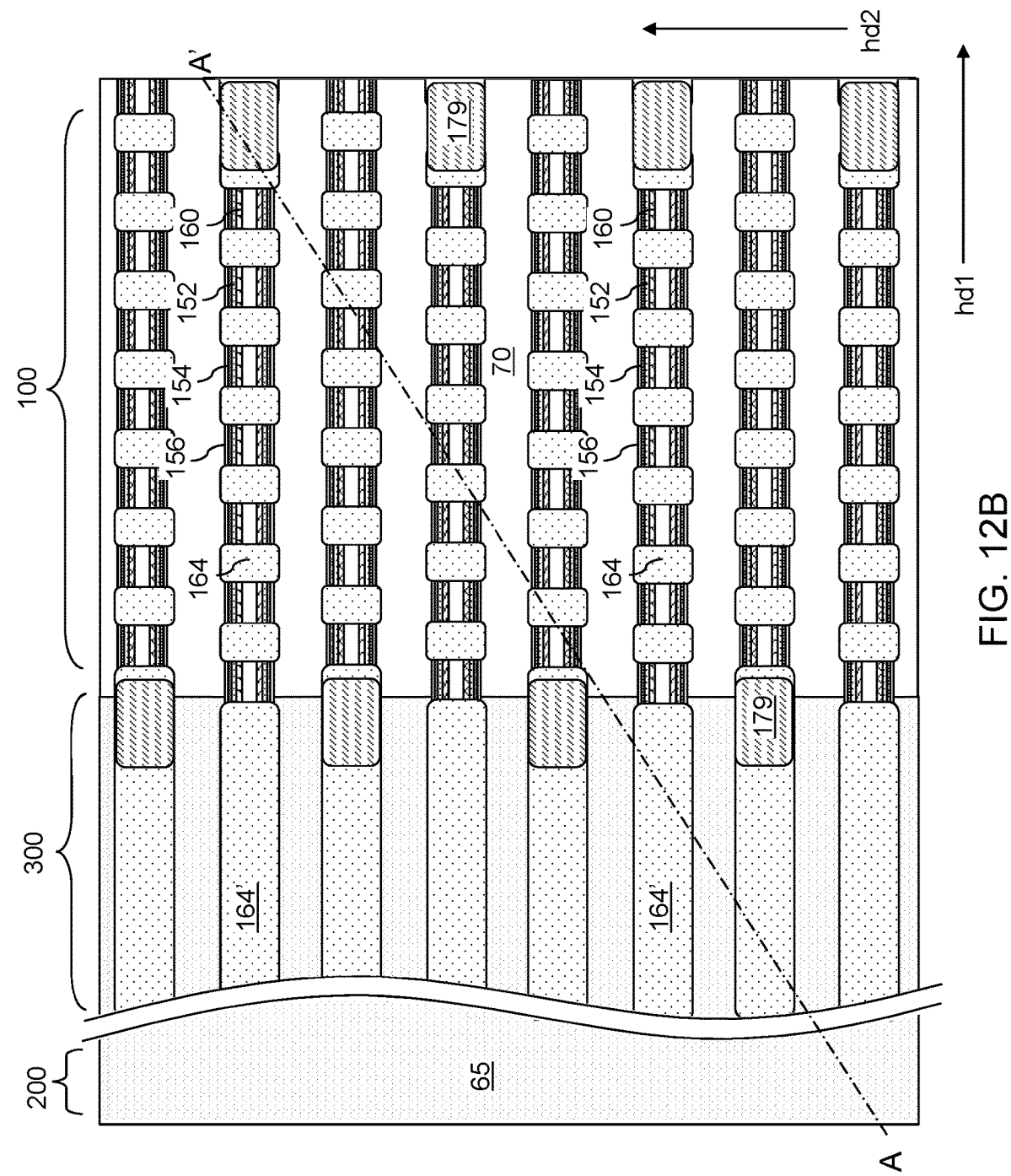
FIG. 12B is a top-down view of the exemplary structure of FIG. 12A. The vertical plane A-A' is the plane of the cross-section for FIG. 12A.

Referring to FIGS. 12A and 12B, backside via cavities 179 can be formed through a subset of the dielectric pillar structures 164 and portions of the dielectric wall structures 164'. The locations of the backside via cavities 179 can be selected such that each sacrificial material strip 42 contacts at least one of the backside via cavities 179. Further, the locations of the backside via cavities can be selected such that each point within the sacrificial material strip 42 is laterally spaced from a most proximal one of the sacrificial material strips 42 by a lateral distance that does not exceed a lateral etch distance during a subsequent etch process that etches the material of the sacrificial material strips 42 selective to the materials of the insulating strips 32 and the tunneling dielectrics 156. In one embodiment, a subset of the backside via cavities 179 can have the same area as a respective one of the dielectric pillar structures 164. In this case, a backside via cavity 179 can be formed by removing a dielectric pillar structure 164. In another embodiment, the backside via cavities 179 can only partially overlap in area with a respective one of the dielectric pillar structures 164. In yet another embodiment, the backside via cavities 179 may overlap in area, at least partially, with two or more of the dielectric pillar structures 164 and with any intervening memory pillar structure 158. In this case, at least one memory pillar structure 158 may be removed during formation of the backside via cavities 179. A subset of the backside via cavities 179 formed through the dielectric wall structures 164' may divide one or more of the dielectric wall structures 164' into multiple discrete portions.

Referring to FIG. 13, an etchant that selectively etches the second material of the sacrificial material strips 42 with respect to the first material of the insulating strips 32 can be introduced into the backside via cavities 179, for example, employing an isotropic etch process. Backside recesses 43 are formed in volumes from which the sacrificial material strips 42 are removed. The removal of the second material of the sacrificial material strips 42 can be selective to the first material of the insulating strips 32, the material of the retro-stepped dielectric material portion 65, the material of the dielectric pillar structures 164 and the dielectric wall structures 164', and the material of the outermost layer of the memory films 150, i.e., the material of the tunneling dielectrics 156. In one embodiment, the sacrificial material strips 42 can include silicon nitride, and the materials of the insulating strips 32 and the retro-stepped dielectric material portion 65 can be silicon oxide materials such as undoped silicate glass and/or a doped silicate glass.

The isotropic etch process that removes the second material selective to the first material and the outermost layer of the memory films 150 can be a wet etch process employing a wet etch solution, or can be a gas phase (dry) etch process in which the etchant is introduced in a vapor phase into the backside via cavities 179. For example, if the sacrificial material strips 42 include silicon nitride, the etch process can be a wet etch process in which the exemplary structure is immersed within a wet etch tank including phosphoric acid, which etches silicon nitride selective to silicon oxide. The duration of the isotropic etch process can be selected such that the sacrificial material strips 42 are completely removed from each alternating stack (32, 42) of insulating strips 32 and sacrificial material strips 42. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating strip 32 and a bottom surface of an overlying insulating strip 32. In one embodiment, each backside recess 43 can have a uniform height throughout. The memory pillar structures 158, the dielectric pillar structures 164, and the dielectric wall structures 164' provide structural support to the exemplary structure during formation of the backside recesses 43.

Figure 14:
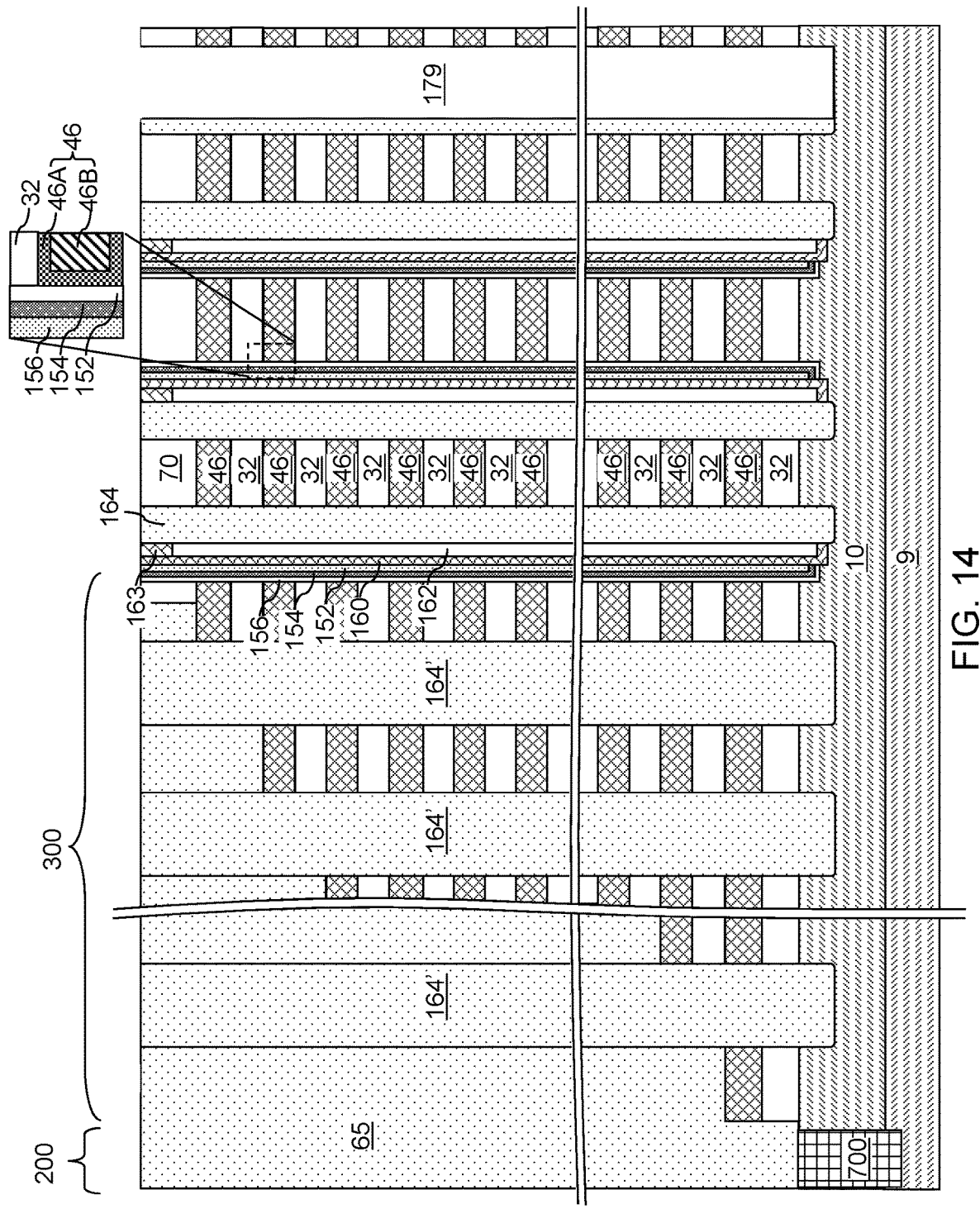
FIG. 14 is a schematic vertical cross-sectional view of the exemplary structure after formation of electrically conductive strips in the backside recesses according to an embodiment of the present disclosure.

Referring to FIG. 14, a metallic barrier layer 46A can be deposited in the backside recesses 43 directly on the physically exposed outer sidewalls of the tunneling dielectrics 156. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in remaining volumes of backside recesses 43, on the sidewalls of the at least one the backside via cavity 179, and over the top surface of the insulating cap layer 70 to form a metallic fill material portion 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion 46B can consist essentially of at least one elemental metal. The at least one elemental metal of the metallic fill material portion 46B can be selected, for example, from tungsten, cobalt, ruthenium, titanium, and tantalum. In one embodiment, the metallic fill material portion 46B can consist essentially of a single elemental metal. In one embodiment, the metallic fill material portion 46B can be deposited employing a fluorine-containing precursor gas such as $WF_6$. In one embodiment, the metallic fill material portion 46B can be a tungsten layer including a residual level of fluorine atoms as impurities.

A plurality of electrically conductive strips 46 (i.e., electrically conductive layers having strip shapes) can be formed in the plurality of backside recesses 43, and a continuous metallic material layer can be formed on the sidewalls of each backside via cavity 179 and over the insulating cap layer 70. Each electrically conductive strip 46 includes a portion of the metallic barrier layer 46A and a metallic fill material portion 46B that are located between a vertically neighboring pair of dielectric material strips such as a pair of insulating strips 32.

The deposited metallic material of the continuous electrically conductive material layer is etched back from the sidewalls of each backside via cavity 179 and from above the insulating cap layer, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 155. In other words, each electrically conductive strip 46 can be a word line that functions as a common control gate electrode for the plurality of vertical memory devices.

While the present disclosure is described employing an embodiment in which the spacer material layers are formed as sacrificial material layers 42, embodiments are expressly contemplated herein in which the spacer material layers are formed as electrically conducive layers, and are divided into electrically conductive strips 46. In one embodiment, division of a vertically alternating sequence into multiple alternating stacks of insulating strips 32 and electrically conductive strips 46 can occur upon formation of the line trenches 149 (i.e., at the processing steps of FIGS. 4A and 4B in case the line trenches 149 extend through the entire length of the contact region 300 along the first horizontal direction hd1). In another embodiment, division of a vertically alternating sequence into multiple alternating stacks of insulating strips 32 and electrically conductive strips 46 can occur upon formation of the discrete via cavities 69 and the elongated via cavities 69' (i.e., at the processing steps of FIGS. 10A-10D in case the line trenches 149 do not completely divide the vertically alternating sequence of insulating layers 32 and electrically conductive layers into multiple alternating stacks (32, 46) of insulating strips 32 and electrically conductive strips 46). Alternatively, the sacrificial material layers 42 can be replaced with the electrically conductive layers 46 through the line trenches 149 between the steps illustrated in FIGS. 5A and 6A. In such cases, the processing steps of FIGS. 13 and 14 can be omitted.

Generally, the electrically conductive strips 46 of the present disclosure can be formed directly on sidewalls of the tunneling dielectrics 156 in case the spacer material layers are formed as sacrificial material layers 42, or the tunneling dielectrics 156 of the present disclosure can be formed directly on sidewalls of the electrically conductive strips 46 in case the spacer material layers are formed as electrically conductive layers or the electrically conductive layers 46 are formed prior to the tunnel dielectrics 156. The electrically conductive strips 46 can comprise at least one conductive material selected from a metal (such as a conductive metallic nitride material, tungsten, cobalt, molybdenum, and/or copper) and a doped semiconductor material including electrical dopants at an atomic concentration of at least $1.0 \times 10^{20}/\text{cm}^3$. The vertical semiconductor channels 160 can include a semiconducting material including electrical dopants at an atomic concentration in a range from $1.0 \times 10^{14}/\text{cm}^3$ to $1.0 \times 10^{18}/\text{cm}^3$.

Figure 15:
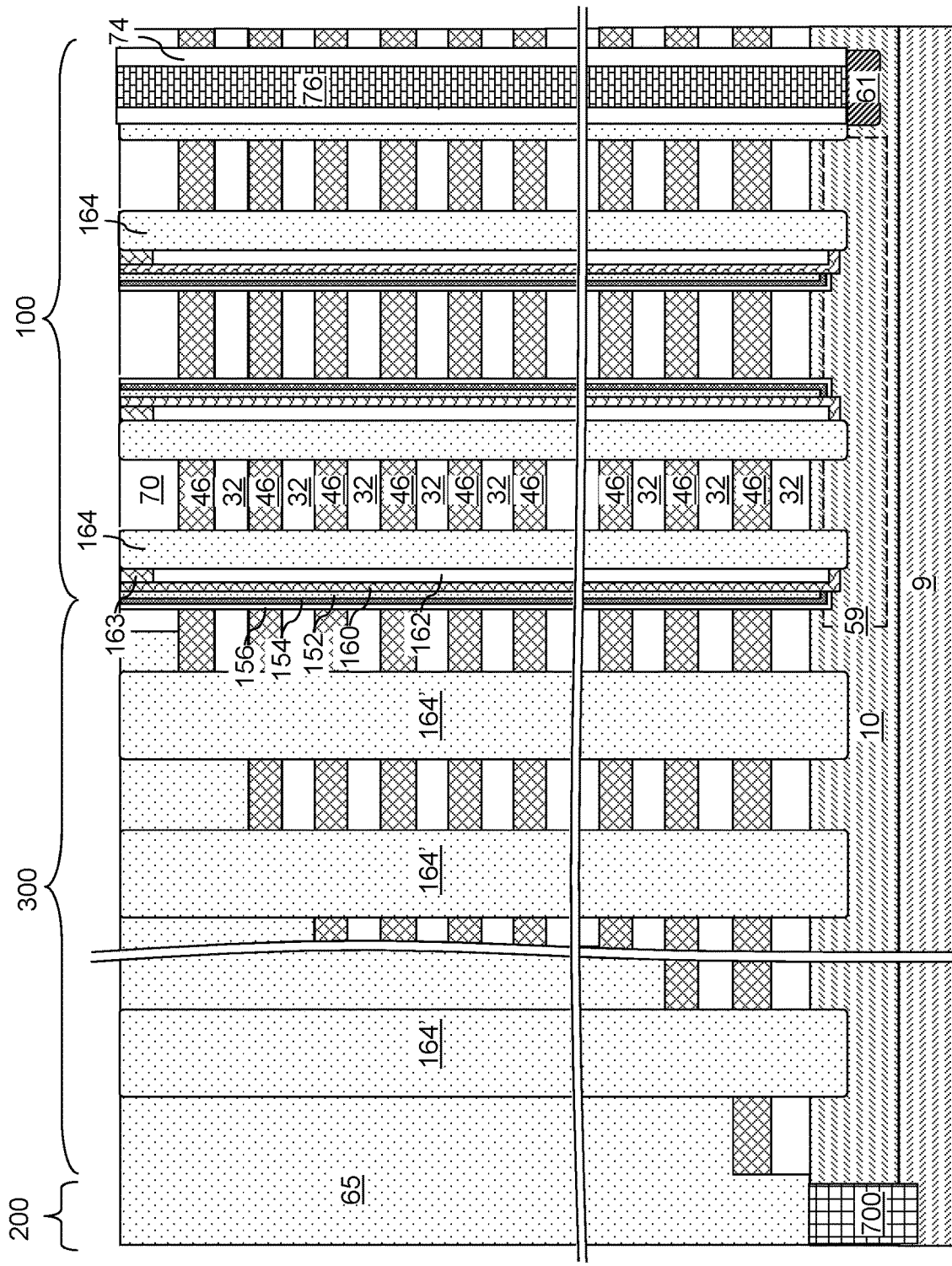
FIG. 15 is a schematic vertical cross-sectional view of the exemplary structure after formation of source regions, insulating spacers, and backside contact via structures according to an embodiment of the present disclosure.

Referring to FIG. 15, the electrically conductive material can be removed from the at least on backside via cavity 179 and an insulating material layer can be formed in the at least one backside via cavity 179 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the insulating cap layer 70 and at the bottom of each backside via cavity 179. Each remaining portion of the insulating material layer constitutes an insulating spacer 74. A backside void is present within a volume surrounded by each insulating spacer 74. A top surface of the semiconductor material layer 10 can be physically exposed at the bottom of each backside void.

A source region 61 can be formed at a surface portion of the semiconductor material layer 10 under each backside void by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

Each surface portion of the semiconductor material layer 10 located between a source region 61 and neighboring bottom ends of the vertical semiconductor channels 160 constitutes a horizontal semiconductor channel 59. Each horizontal semiconductor channel 59 contacts the source region 61 and a plurality of vertical semiconductor channels 160. Each source region 61 is formed in an upper portion of the semiconductor substrate (9, 10). Semiconductor channels (59, 160) extend between each source region 61 and a respective set of drain regions 163. The semiconductor channels (59, 160) include the vertical semiconductor channels 160 of the memory stack structures 155.

A backside contact via structure 76 can be formed within each backside voids. Each contact via structure 76 can fill a respective backside void. The contact via structures 76 can be formed by depositing at least one conductive material in the remaining unfilled volumes of the backside via cavities 179. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the insulating cap layer 70 overlying the alternating stacks (32, 46) as a stopping layer. If chemical mechanical planarization (CMP) process is employed, the insulating cap layer 70 can be employed as a CMP stopping layer. Each remaining continuous portion of the at least one conductive material in the backside via cavities 179 constitutes a backside contact via structure 76. Each backside contact via structure 76 extends through the alternating stacks (32, 46), and contacts a top surface of a respective source region 61. Alternatively, a horizontal source line can be located under the alternating stacks (32, 46) in electrical contact with the lower parts of the vertical semiconductor channels 160.

Figure 16A:
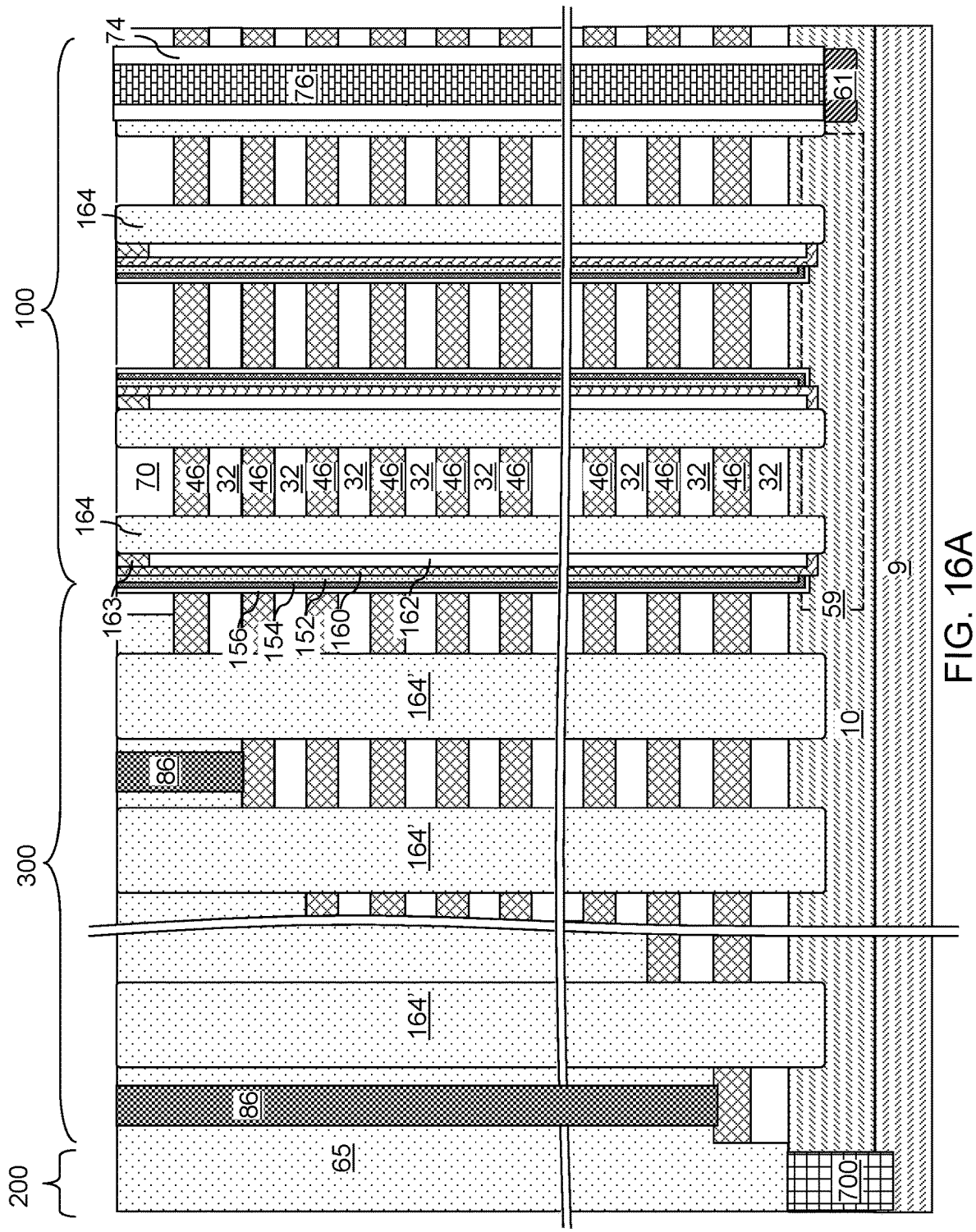
FIG. 16A is a schematic vertical cross-sectional view of the exemplary structure after formation of word line contact via structures according to an embodiment of the present disclosure.
Figure 16B:
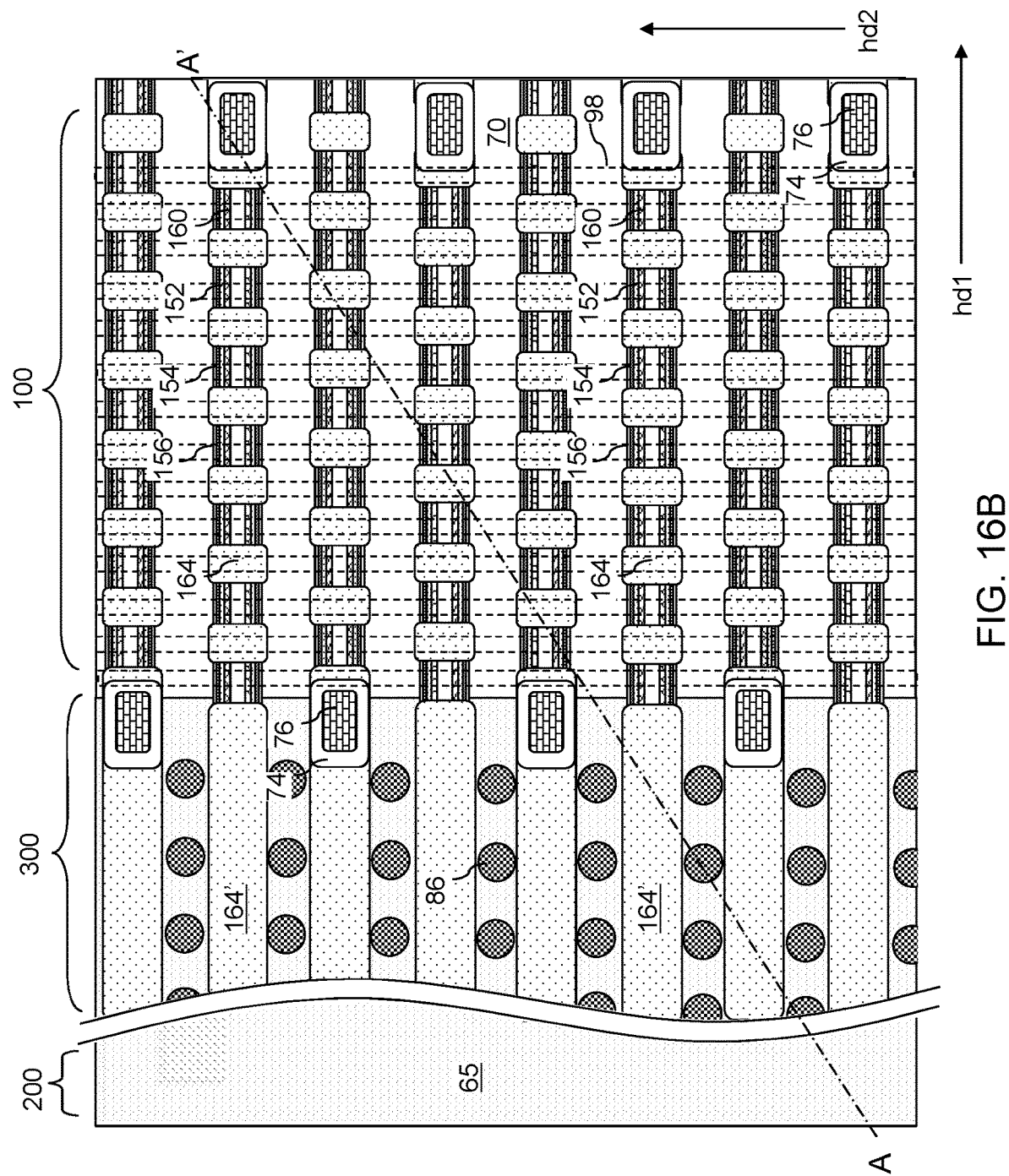
FIG. 16B is a top-down view of the exemplary structure of FIG. 16A. The vertical plane A-A' is the plane of the cross-section for FIG. 16A.

Referring to FIGS. 16A and 16B, contact via structures 86 (which are herein referred to as word line contact via structures) can be formed on the electrically conductive strips 46 through the retro-stepped dielectric material portion 65. A two-dimensional array of contact via structures 86 can be formed on a top surface of a respective one of the electrically conductive strips 46 in the contact region 300.

Additional contact via structures and additional dielectric material layers can be formed over the insulating cap layer 70. For example, drain contact via structures (not expressly illustrated) can be formed on a top surface of each drain region 63 within the active memory pillar structures 158 (i.e., memory pillar structures 158 that are not employed as dummy structures and are electrically active). Bit lines 98 can be formed to electrically contact every other drain region 163 along the second horizontal direction hd2, i.e., a respective set of drain regions 163 located within every other line trench 149 along the second horizontal direction. An exemplary layout for the bit lines 98 is illustrated in FIG. 16B. In this configuration, each electrically conductive strip 46, functioning as a word line, activates only a single portion of the memory cell (e.g., a single portion of the memory film 150) per bit line 98, and can program or read the uniquely selected memory cell corresponding to a single activated portion of one of the memory films 150.

Referring to all drawings and according to various embodiments of the present disclosure, a three-dimensional memory device is provided, which comprises: alternating stacks of insulating strips 32 and electrically conductive strips 46 located over a substrate (9, 10) and laterally spaced apart among one another by line trenches 149, wherein the line trenches 149 laterally extend along a first horizontal direction hd1 and are spaced apart along a second horizontal direction hd2, and a two-dimensional array of memory stack structures 155 and a two-dimensional array of dielectric pillar structures 164 located in the line trenches 149, wherein each line trench 149 is filled with a laterally alternating sequence (155, 164) of memory stack structures 155 and dielectric pillar structures 164 (e.g., an interlaced structure including a row of memory stack structures 155 and a row of dielectric pillar structures 164). Each memory stack structure 155 comprises a vertical semiconductor channel 160, a pair of blocking dielectrics 152 contacting outer sidewalls of the vertical semiconductor channel 160, a pair of charge storage layers 154 contacting outer sidewalls of the pair of blocking dielectrics 152, a pair of tunneling dielectrics 156 contacting outer sidewalls of the pair of charge storage layers 154, wherein each of the pair of tunneling dielectrics 156 contacts sidewalls of each layer within a respective alternating stack of insulating strips 32 and electrically conductive strips 46.

In one embodiment, material compositions and thicknesses of the blocking dielectrics 152 and the tunneling dielectrics 156 are selected such that charge tunneling occurs through a tunneling dielectric 156 of a memory stack structure 155 while charge tunneling does not occur through any blocking dielectric 152 of the memory stack structure 155 upon application of an electrical bias within a programming voltage range across a vertical semiconductor channel 160 of the memory stack structure 155 and an adjacent electrically conductive strip 46.

In one embodiment, sidewalls of the pair of tunneling dielectrics 156 are located within first flat two-dimensional vertical planes that are parallel to the first horizontal direction hd1; and interfaces between the pair of blocking dielectrics 152 and the vertical semiconductor channel 160 are located within second flat two-dimensional vertical planes that are parallel to the first horizontal direction hd1.

In one embodiment, each blocking dielectric 152 has a uniform thickness that is a blocking dielectric thickness $d_b$ and an effective dielectric constant that is a blocking dielectric constant $\varepsilon_b$, each tunneling dielectric 156 has a uniform thickness that is a tunneling dielectric thickness $d_t$ and an effective dielectric constant that is a tunneling dielectric constant $\varepsilon_t$, and a ratio of the blocking dielectric constant $\varepsilon_b$ to the blocking dielectric thickness $d_b$ is greater than a ratio of the tunneling dielectric constant $\varepsilon_t$ to the tunneling dielectric thickness $d_t$. In one embodiment, each blocking dielectric 156 comprises, or consists essentially of, a hafnium oxide layer, each charge storage layer 154 comprises, or consists essentially of, silicon nitride, and each tunneling dielectric 156 comprises, or consists of, a stack of silicon oxide, silicon oxynitride and silicon oxide layers.

In one embodiment, the three-dimensional memory device comprises a two-dimensional array of drain regions 163 contacting a top portion of a respective one of the vertical semiconductor channels 160 in the two-dimensional array of memory stack structures 155. In one embodiment, each vertical semiconductor channel 160 comprises a pair of vertically extending wing portions 160W that contact inner sidewalls of a respective blocking dielectric 152 and a horizontal connecting portion 160H that is adjoined to bottom regions of the pair of vertically extending wing portions 160W and contacting a semiconductor material layer 10 in the substrate (9, 10). A two-dimensional array of dielectric cores 162 can contact inner sidewalls of a respective vertical semiconductor channel 160, underlie a respective drain region 163, and laterally contact a respective pair of dielectric pillar structures 164.

Figure 10A:
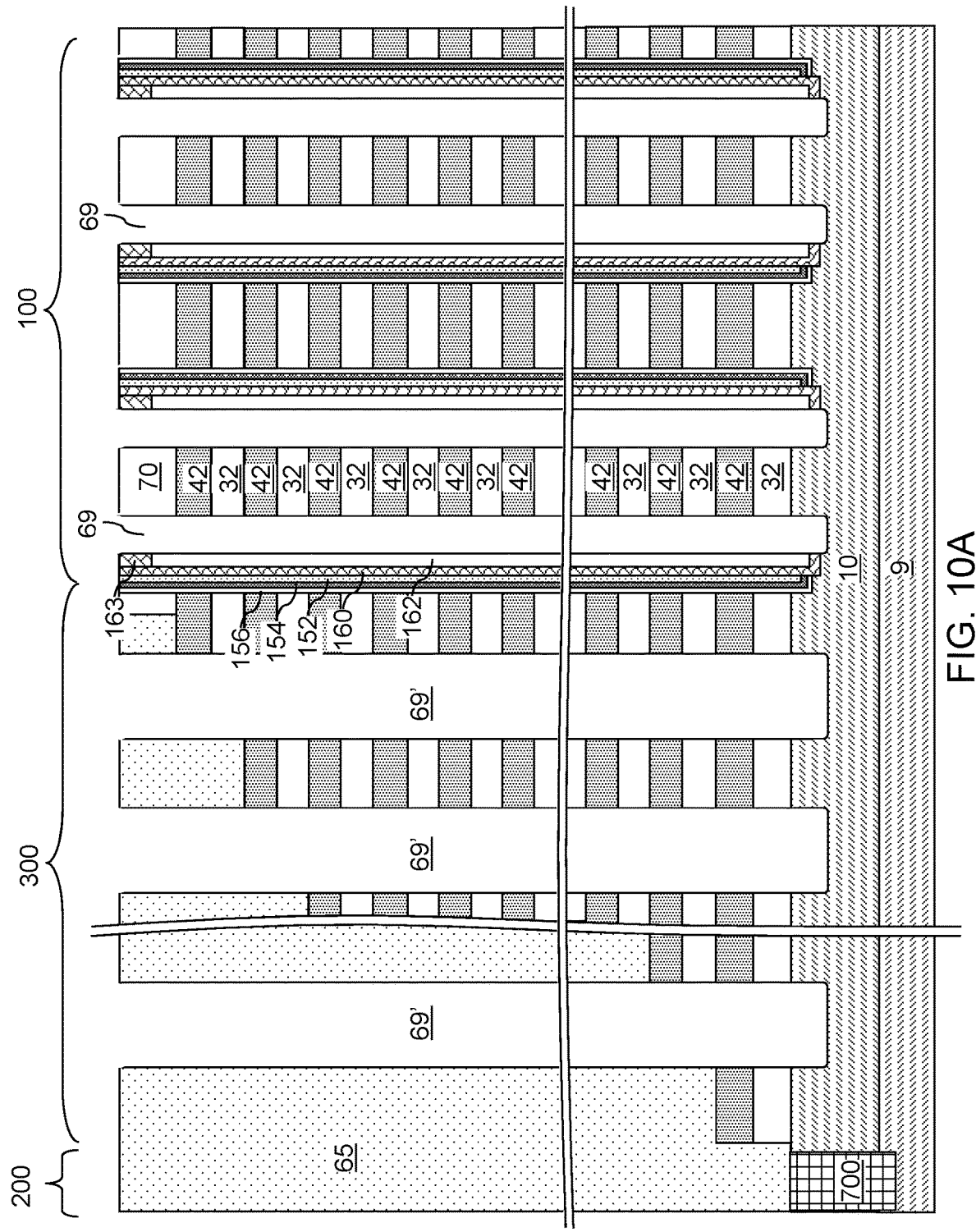
FIG. 10A is a vertical cross-sectional view of the exemplary structure after formation of via cavities through line trench fill structures according to an embodiment of the present disclosure.
Figure 10B:
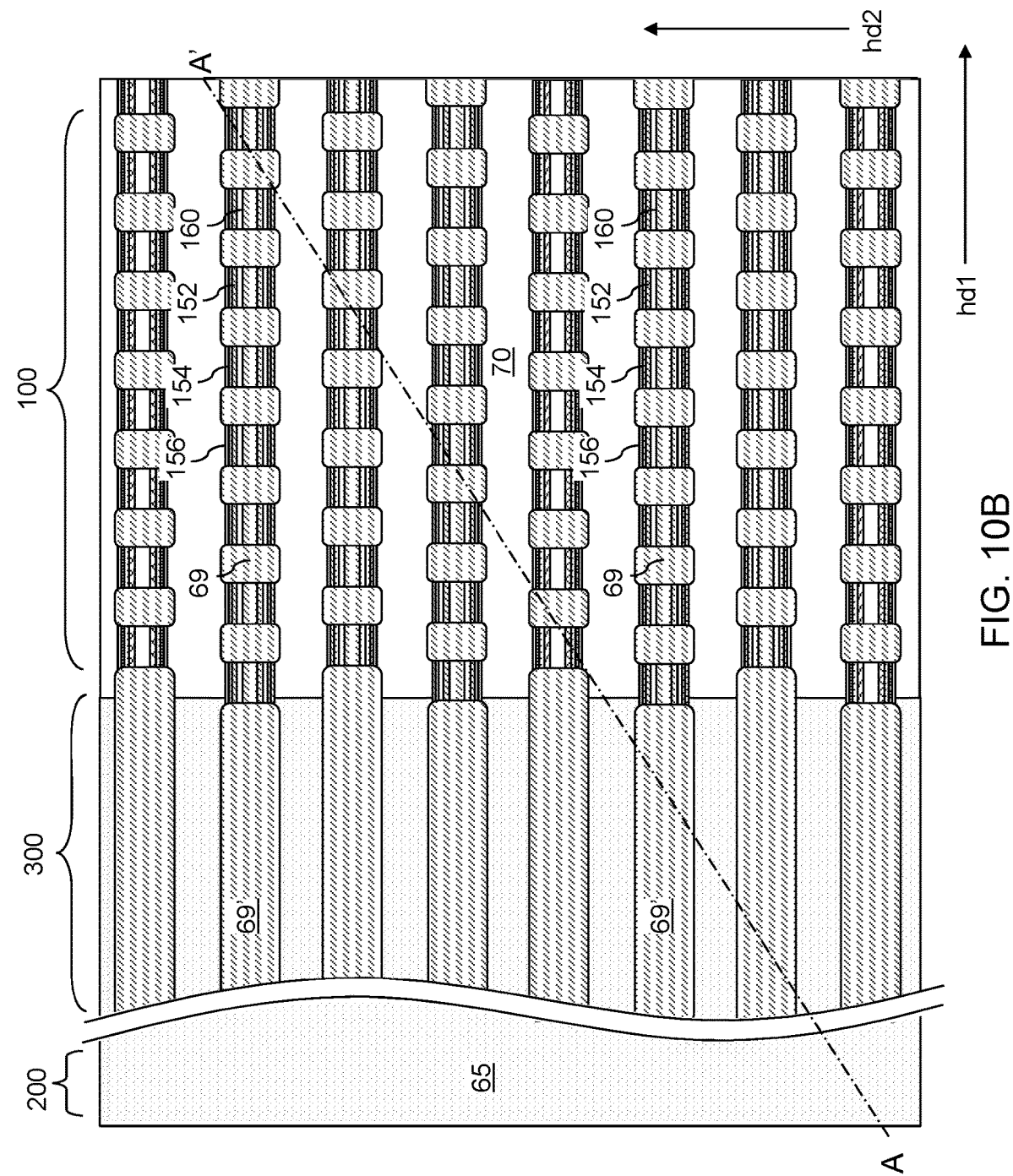
FIG. 10B is a top-down view of the exemplary structure of FIG. 10A. The vertical plane A-A' is the plane of the cross-section for FIG. 10A.
Figure 10C:
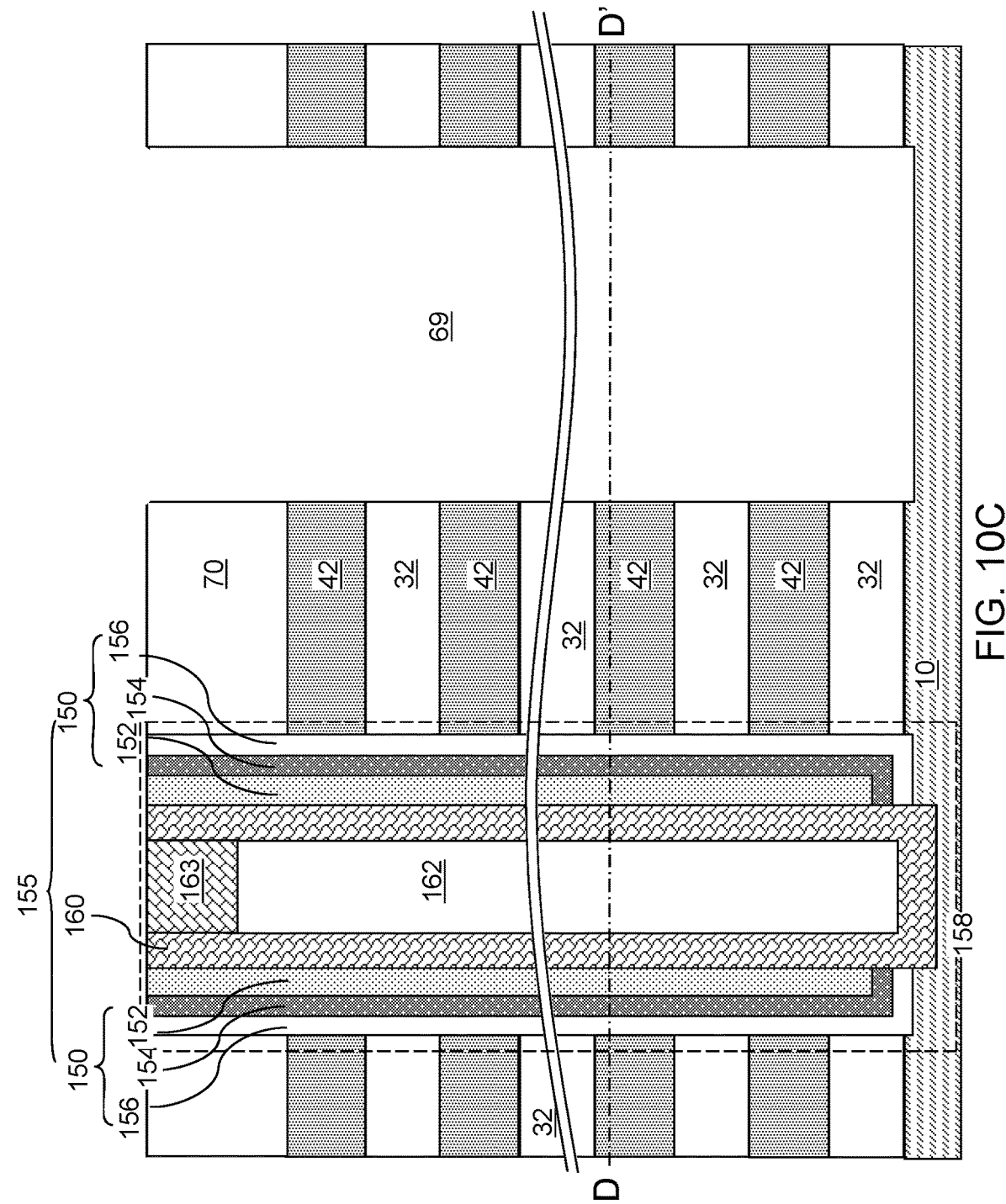
FIG. 10C is a vertical cross-sectional view of a region of the exemplary structure of FIG. 10A.
Figure 10D:
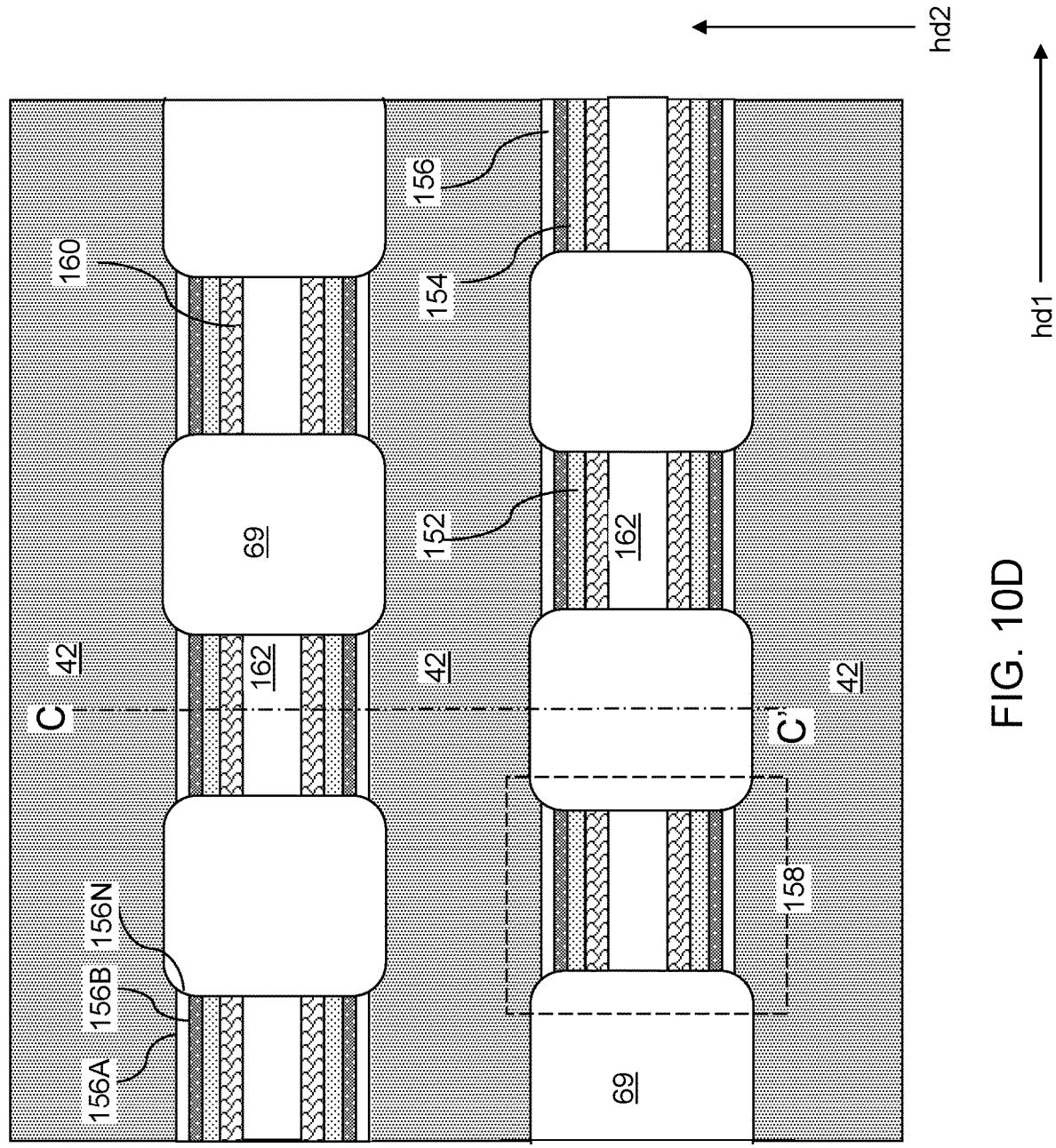
FIG. 10D is a horizontal cross-sectional view along the plane D-D' of FIG. 10C.
Figure 11A:
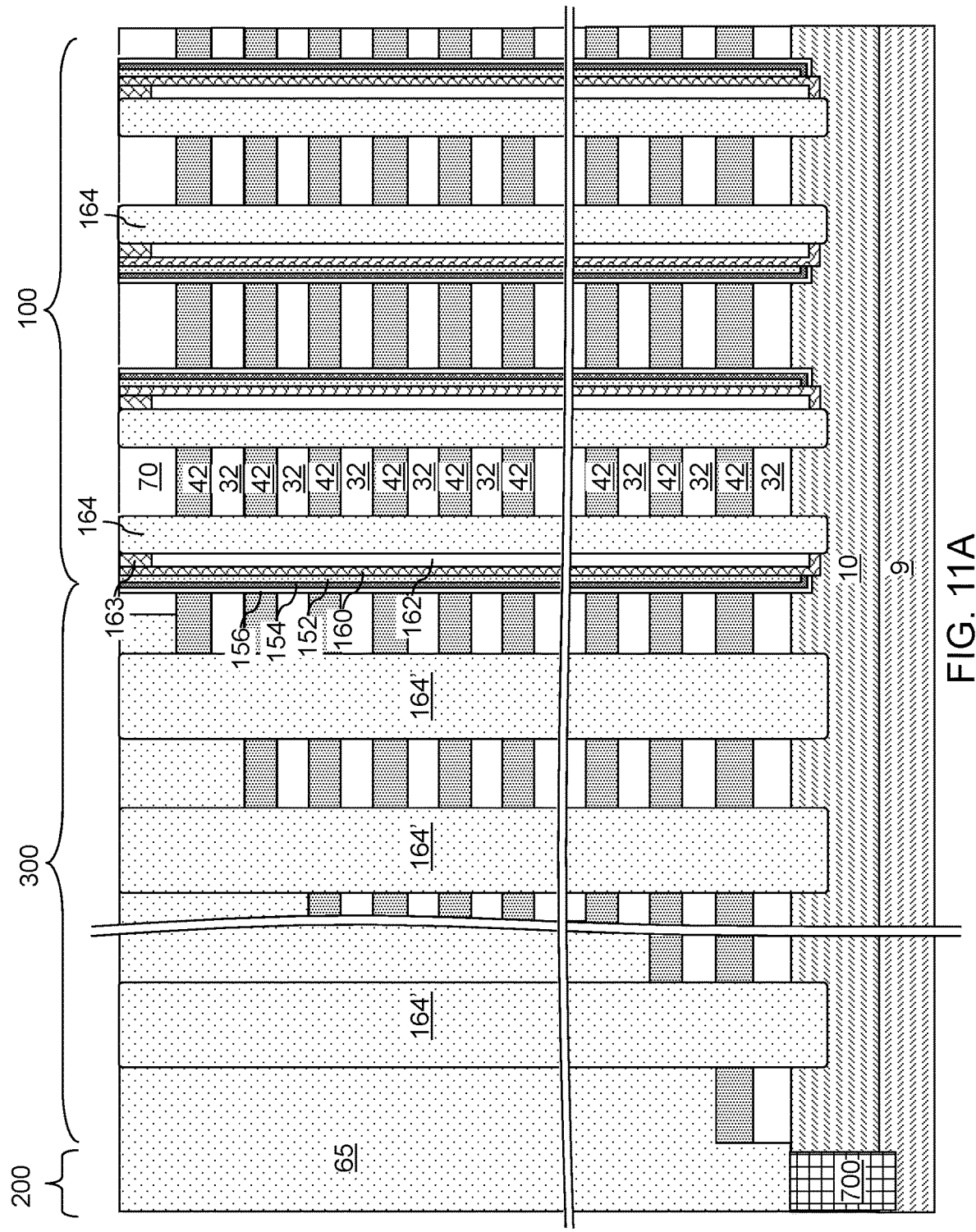
FIG. 11A is a vertical cross-sectional view of the exemplary structure after formation of dielectric pillar structures in the via cavities according to an embodiment of the present disclosure.
Figure 11B:
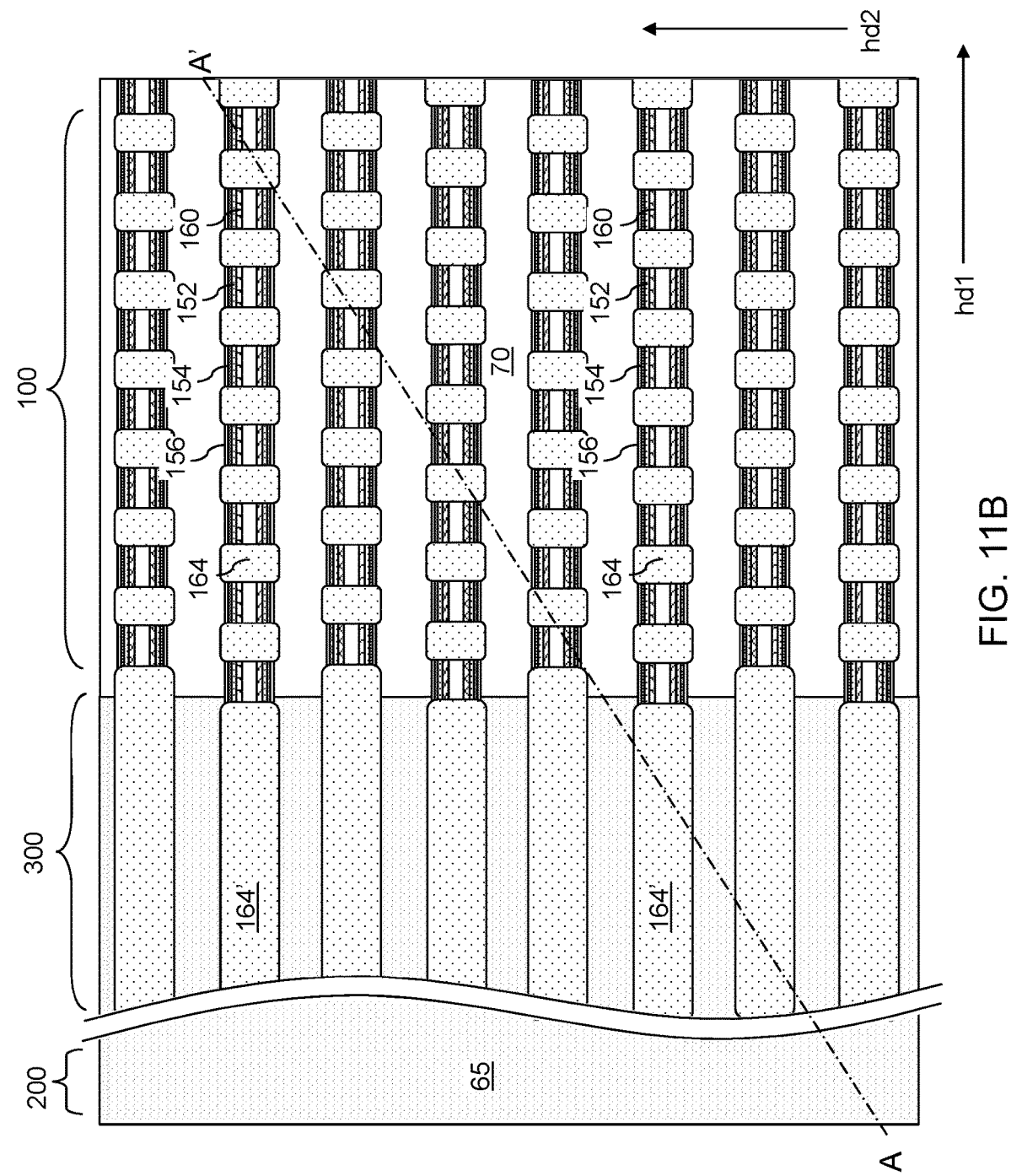
FIG. 11B is a top-down view of the exemplary structure of FIG. 11A. The vertical plane A-A' is the plane of the cross-section for FIG. 11A.
Figure 11C:
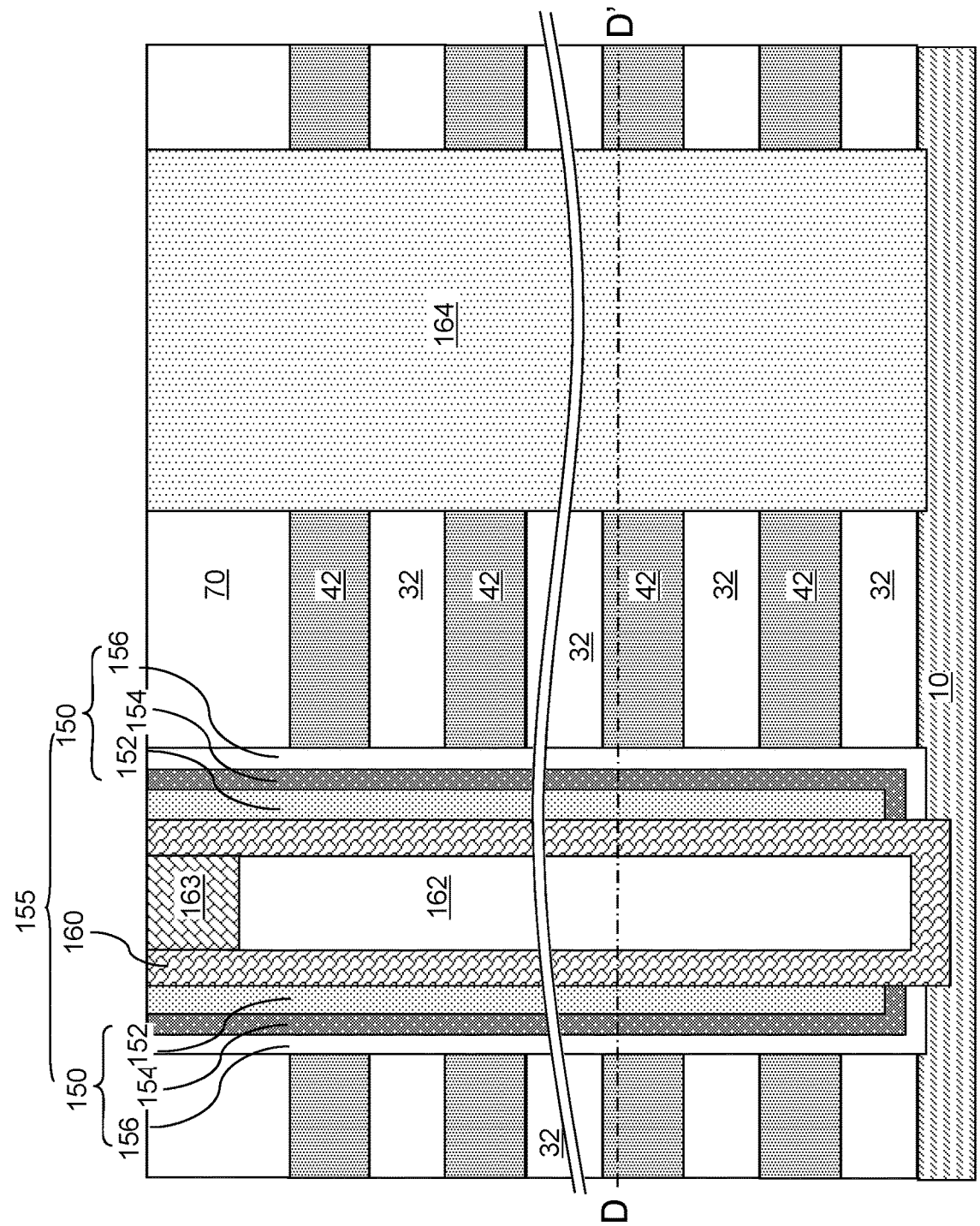
FIG. 11C is a vertical cross-sectional view of a region of the exemplary structure of FIG. 11A.
Figure 11D:
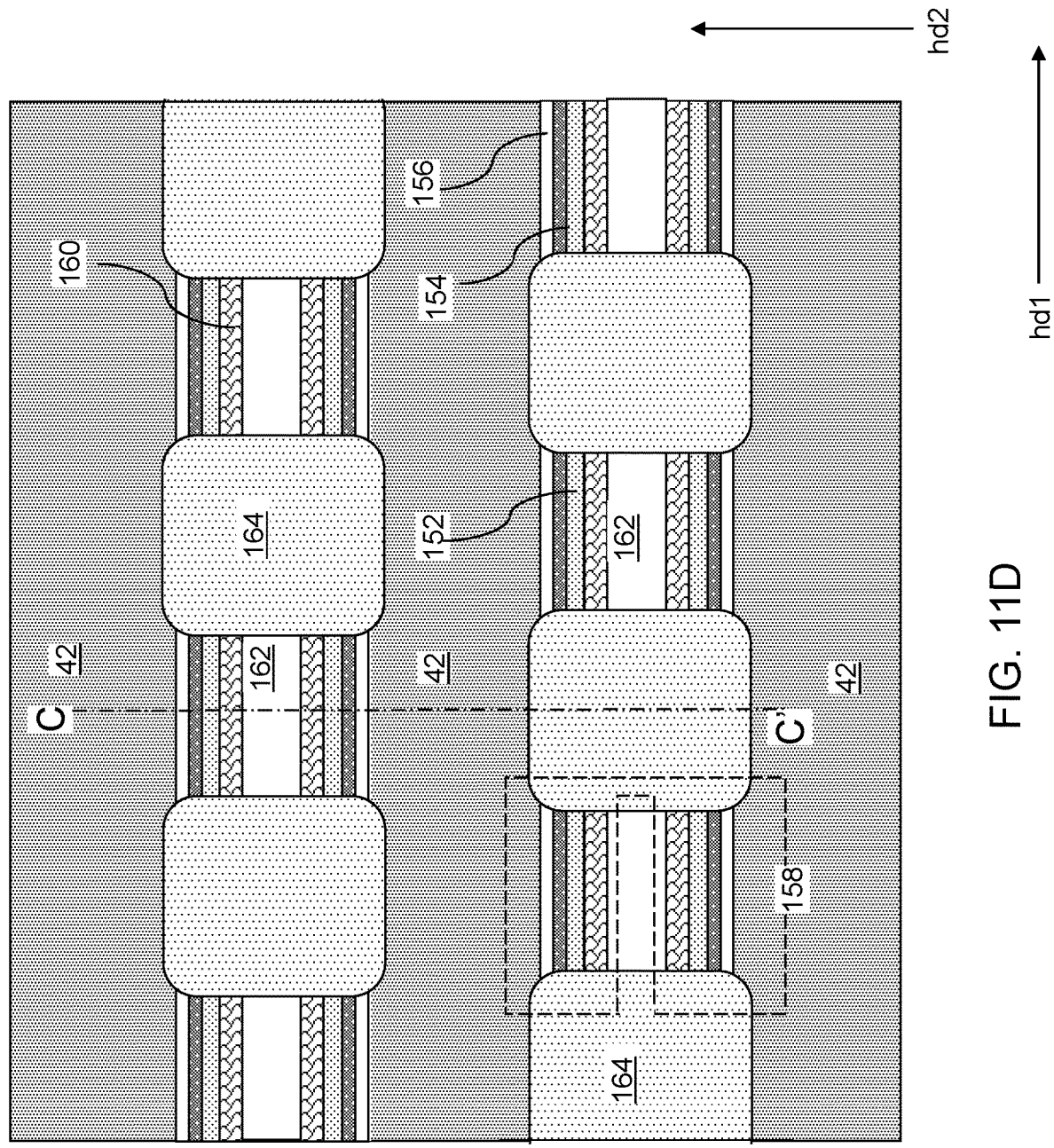
FIG. 11D is a horizontal cross-sectional view along the plane D-D' of FIG. 11C.

In one embodiment shown in FIG. 10D, each of the tunneling dielectrics 156 has a horizontal cross-sectional shape having a fluted profile (i.e., a profile having a gradually increasing width along a direction) in which an outer vertical sidewall 156A along the first horizontal direction hd1 has a greater lateral dimension than an inner vertical sidewall 156B along the first horizontal direction hd1, and interfaces 156N of the tunneling dielectrics 156 with dielectric pillar structures 164 have a curvature.

In one embodiment, the electrically conductive strips 46 comprise a conductive material selected from a metal and a doped semiconductor material including electrical dopants at an atomic concentration of at least $1.0 \times 10^{20}/cm^3$, and the vertical semiconductor channel 160 comprises a semiconducting material including electrical dopants at an atomic concentration in a range from $1.0 \times 10^{14}/cm^3$ to $1.0 \times 10^{18}/cm^3$.

In one embodiment, the vertical semiconductor channel 160, the pair of blocking dielectrics 152, the pair of charge storage layers 154, and the pair of tunneling dielectrics 156 of each memory stack structure 155 contacts sidewalls of a respective pair of dielectric pillar structures 164.

In one embodiment, the three-dimensional memory device can comprise: a contact region 300 in which each alternating stack (32, 46) has respective stepped surfaces that extend from the substrate (9, 10) to a topmost strip within a respective alternating stack (32, 46), and a two-dimensional array of contact via structures 86 contacting a top surface of a respective one of the electrically conductive strips 46 within the alternating stacks (32, 46) in the contact region 300.

According to an aspect of the present disclosure, the disadvantages of the prior art flat configuration are overcome by providing the inverse flat cell structure, in which the positions of the blocking dielectric 152 and the tunneling dielectric 156 are reversed compared to the prior art configurations. Thus, the tunneling dielectric 156 is located immediately next to the electrically conductive strips 46, which function as control gate electrodes/word lines of the NAND device. The charge storage layer 154 is located immediately adjacent to the tunneling dielectric 156, and the blocking dielectric 152 is located immediately adjacent to the charge storage layer 154. The vertical semiconductor channel 160 is located on the blocking dielectric 152, and charge tunneling occurs across the tunneling dielectric 156 between the word lines 46 and the charge storage layer 154. In other words, the tunneling dielectric 156 is located between the control gate electrodes/word lines 46 and the charge storage layer 154, while the blocking dielectric 152 is located between the charge storage layer 154 and the vertical semiconductor channel 160.

The benefit of using this inverse cell structure (tunnel oxide and blocking layer position swapped compared with the prior art charge trapping structure) includes larger threshold voltage windows for programming and for erasing data. The threshold voltage Vt for a programming operation is given by:

$$Vt = (VPGM - E_{OX} \cdot d_{EOT}) \frac{C_{BLK}}{C_{TNL}} + E_{ON} \cdot d_{EOT}$$

in which VPGM refers to the programming voltage, $E_{OX}$ refers to the electrical field required to turn on a vertical semiconductor channel 160, $d_{EOT}$ refers to the effective oxide thickness of a gate dielectric, $C_{BLK}$ refers to the capacitance per unit area of a capacitor employing the blocking dielectric 152 as a capacitor node dielectric, and $C_{TNL}$ refers to the capacitance per unit area of a capacitor employing the tunneling dielectric 156 as a capacitor node dielectric.

Taking a derivative of the above equation, the threshold voltage for programming and the programming voltage are related by:

$$\frac{dVt}{dVPGM} = \frac{C_{BLK}}{C_{TNL}}$$

Thus, when $C_{BLK}/C_{TNL} > 1$, the program slope can be greater than 1. The inverse flat configuration of the embodiments of the present disclosure can provide a large Vt window to make programming (and program inhibit) easier.

During an erase operation, the threshold voltage Vt for the erase operation is given by:

$$Vt = (-VERA + E_{OX} \cdot d_{EOT})\frac{C_{BLK}}{C_{TNL}} + E_{ON} \cdot d_{EOT}$$

in which VERA refers to the erase voltage.

Taking a derivative of the above equation, the threshold voltage for erase and the erase voltage are related by:

$$\frac{dVt}{dVERA} = -\frac{C_{BLK}}{C_{TNL}}$$

Thus, when $C_{BLK}/C_{TNL} > 1$, the erase slope can be greater than 1. The inverse flat configuration of the embodiments of the present disclosure can provide a large Vt window to make the erase operation easier.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   alternating stacks of insulating strips and electrically conductive strips located over a substrate and laterally spaced apart among one another by line trenches, wherein the line trenches laterally extend along a first horizontal direction and are spaced apart along a second horizontal direction; and
   a two-dimensional array of memory stack structures and a two-dimensional array of dielectric pillar structures located in the line trenches, wherein each line trench is filled with laterally alternating sequence of memory stack structures and dielectric pillar structures,
   wherein each memory stack structure comprises a vertical semiconductor channel, a pair of blocking dielectrics contacting outer sidewalls of the vertical semiconductor channel, a pair of charge storage layers contacting outer sidewalls of the pair of blocking dielectrics, a pair of tunneling dielectrics contacting outer sidewalls of the pair of charge storage layers, wherein each of the pair of tunneling dielectrics contacts sidewalls of each layer within a respective alternating stack of insulating strips and electrically conductive strips.

2. The three-dimensional memory device of claim 1, wherein material compositions and thicknesses of the blocking dielectrics and the tunneling dielectrics are selected such that charge tunneling occurs through a tunneling dielectric of a memory stack structure while charge tunneling does not occur through any blocking dielectric of the memory stack structure upon application of an electrical bias within a programming voltage range across a vertical semiconductor channel of the memory stack structure and an adjacent electrically conductive strip.

3. The three-dimensional memory device of claim 1, wherein:
   sidewalls of the pair of tunneling dielectrics are located within first flat two-dimensional vertical planes that are parallel to the first horizontal direction; and
   interfaces between the pair of blocking dielectrics and the vertical semiconductor channel are located within second flat two-dimensional vertical planes that are parallel to the first horizontal direction.

4. The three-dimensional memory device of claim 1, wherein:
   each blocking dielectric has a uniform thickness that is a blocking dielectric thickness and an effective dielectric constant that is a blocking dielectric constant;
   each tunneling dielectric has a uniform thickness that is a tunneling dielectric thickness and an effective dielectric constant that is a tunneling dielectric constant; and
   a ratio of the blocking dielectric constant to the blocking dielectric thickness is greater than a ratio of the tunneling dielectric constant to the tunneling dielectric thickness.

5. The three-dimensional memory device of claim 4, wherein:
   the three-dimensional memory device comprises a NAND memory device;
   each blocking dielectric comprises a hafnium oxide layer;
   each charge storage layer comprises silicon nitride; and
   each tunneling dielectric comprises a stack of silicon oxide, silicon oxynitride and silicon oxide layers.

6. The three-dimensional memory device of claim 1, further comprising a two-dimensional array of drain regions contacting a top portion of a respective one of the vertical semiconductor channels in the two-dimensional array of memory stack structures.

7. The three-dimensional memory device of claim 6, wherein each vertical semiconductor channel comprises a pair of vertically extending wing portions that contact inner sidewalls of a respective blocking dielectric and a horizontal connecting portion that is adjoined to bottom regions of the pair of vertically extending wing portions and contacting a semiconductor material layer in the substrate.

8. The three-dimensional memory device of claim 7, further comprising a two-dimensional array of dielectric cores contacting inner sidewalls of a respective vertical semiconductor channel, underlying a respective drain region, and laterally contacting a respective pair of dielectric pillar structures.

9. The three-dimensional memory device of claim 1, wherein each of the tunneling dielectrics has a horizontal cross-sectional shape having a fluted profile in which an outer vertical sidewall along the first horizontal direction has a greater lateral dimension than an inner vertical sidewall along the first horizontal direction and interfaces with dielectric pillar structures have a curvature.

10. The three-dimensional memory device of claim 1, wherein:
   the electrically conductive strips comprise a conductive material selected from a metal and a doped semiconductor material including electrical dopants at an atomic concentration of at least $1.0 \times 10^{20}/cm^3$; and the vertical semiconductor channel comprises a semiconducting material including electrical dopants at an atomic concentration in a range from $1.0\times10^{14}/cm^3$ to $1.0\times10^{18}/cm^3$.

11. The three-dimensional memory device of claim 1, wherein the vertical semiconductor channel, the pair of blocking dielectrics, the pair of charge storage layers, and the pair of tunneling dielectrics of each memory stack structure contacts sidewalls of a respective pair of dielectric pillar structures.

12. The three-dimensional memory device of claim 1, further comprising:
- a contact region in which each alternating stack has respective stepped surfaces that extend from the substrate to a topmost strip within a respective alternating stack; and
- a two-dimensional array of contact via structures contacting a top surface of a respective one of the electrically conductive strips within the alternating stacks in the contact region.

13. A method of forming a three-dimensional memory device, comprising:
- forming a vertically alternating sequence of insulating layers and spacer material layers over a substrate;
- forming line trenches laterally extending along a first horizontal direction through the vertically alternating sequence;
- forming line trench fill structures in the line trenches, wherein each line trench fill structure comprises a pair of tunneling dielectric sheets contacting remaining portions of the vertically alternating sequence, a pair of charge storage sheets contacting the pair of tunneling dielectric sheets, and a pair of blocking dielectric sheets contacting the pair of charge storage sheets, and a semiconductor channel material sheet located sidewalls of the pair of respective blocking dielectric sheets; and
- dividing the line trench fill structures by forming a two-dimensional array of dielectric pillar structures through the line trench fill structures, wherein remaining portions of the line trench fill structures comprise memory stack structures,
- wherein the spacer material layers are formed as electrically conductive layers that are divided into electrically conductive strips upon formation of the line trenches, or are formed as sacrificial material layers that are replaced with electrically conductive strips.

14. The method of claim 13, wherein:
the line trenches have a respective uniform width that is invariant under translation along the first horizontal direction; and
each tunneling dielectric sheet is formed by depositing a continuous tunneling dielectric material layer directly on sidewalls of the line trenches and removing portions of the continuous tunneling dielectric material layer from above the vertically alternating sequence.

15. The method of claim 13, wherein:
each blocking dielectric sheet has a uniform thickness that is a blocking dielectric thickness and an effective dielectric constant that is a blocking dielectric constant;
each tunneling dielectric sheet has a uniform thickness that is a tunneling dielectric thickness and an effective dielectric constant that is a tunneling dielectric constant; and
a ratio of the blocking dielectric constant to the blocking dielectric thickness is greater than a ratio of the tunneling dielectric constant to the tunneling dielectric thickness.

16. The method of claim 15, wherein:
each blocking dielectric sheet comprises a hafnium oxide layer;
each charge storage sheet comprises silicon nitride; and
each tunneling dielectric sheet comprises a stack of silicon oxide, silicon oxynitride and silicon oxide layers.

17. The method of claim 13, wherein each memory stack structure comprises a vertical semiconductor channel that is a patterned portion of a respective semiconductor channel material sheet, a pair of blocking dielectrics that are patterned portions of a respective pair of blocking dielectric sheets, a pair of charge storage layers that are patterned portions of a respective pair of charge storage sheets, a pair of tunneling dielectrics that are patterned portions of a respective pair of tunneling dielectric sheets.

18. The method of claim 17, wherein:
each semiconductor channel material sheet is formed with a U-shaped vertical cross-sectional profile and comprises a pair of vertically extending wing portions and a horizontal connecting portion that is adjoined to bottom regions of the pair of vertically extending wing portions; and
the method further comprises forming a stack of a dielectric core rail and a drain region rail within each semiconductor channel material sheet, wherein each dielectric core rail and each drain region rail are divided into a plurality of dielectric cores and a plurality of drain regions upon dividing the line trench fill structures.

19. The method of claim 13, wherein the two-dimensional array of dielectric pillar structures is formed by:
forming a two-dimensional array of via cavities extending through the line trench fill structures, wherein each of the via cavities extends to the substrate and sidewalls of remaining portions of the insulating layers and the spacer material layers are physically exposed around the via cavities;
depositing a dielectric fill material in the via cavities; and
planarizing the dielectric fill material from above a topmost layer of the vertically alternating sequence, wherein remaining portions of the dielectric fill material constitute the two-dimensional array of dielectric pillar structures.

20. The method of claim 13, wherein:
the spacer material layers are formed as sacrificial material layers;
the method further comprises replacing the sacrificial material layers with the electrically conductive strips;
the electrically conductive strips are formed directly on sidewalls of the tunneling dielectrics;
the electrically conductive strips comprise a conductive material selected from a metal and a doped semiconductor material including electrical dopants at an atomic concentration of at least $1.0\times10^{20}/cm^3$; and
the semiconductor channel material sheets comprise a semiconducting material including electrical dopants at an atomic concentration in a range from $1.0\times10^{14}/cm^3$ to $1.0\times10^{18}/cm^3$.

* * * * *